(12) United States Patent
Bureau et al.

(10) Patent No.: US 8,133,549 B2
(45) Date of Patent: Mar. 13, 2012

(54) METHOD FOR MODIFYING INSULATING OR SEMI-CONDUCTIVE SURFACES, AND RESULTING PRODUCTS

(75) Inventors: Christophe Bureau, Juvisy-sur-Orge (FR); Jean Pinson, Fontenay-Sous-Bois (FR)

(73) Assignee: Alchimer, Massy (FR)

( * ) Notice: Subject to any disclaimer, the term of this patent is extended or adjusted under 35 U.S.C. 154(b) by 714 days.

(21) Appl. No.: 12/091,894

(22) PCT Filed: Oct. 9, 2006

(86) PCT No.: PCT/FR2006/002260
§ 371 (c)(1), (2), (4) Date: Sep. 26, 2008

(87) PCT Pub. No.: WO2007/048894
PCT Pub. Date: May 3, 2007

(65) Prior Publication Data
US 2009/0301862 A1   Dec. 10, 2009

(30) Foreign Application Priority Data
Oct. 26, 2005   (FR) ...................... 05 10914

(51) Int. Cl.
*C08F 2/00* (2006.01)
*C08J 7/00* (2006.01)
*H01L 21/31* (2006.01)

(52) U.S. Cl. ............ 427/487; 427/508; 522/32; 522/86; 438/758

(58) Field of Classification Search .................... 522/32, 522/86; 430/270.1, 281.1; 427/520, 508, 427/487; 438/758
See application file for complete search history.

(56) References Cited

U.S. PATENT DOCUMENTS

| | | | | |
|---|---|---|---|---|
| 7,176,146 B2 * | 2/2007 | Tour et al. | ...... | 438/765 |
| 7,182,822 B2 * | 2/2007 | Pinson et al. | ...... | 148/241 |
| 7,229,668 B2 * | 6/2007 | Fagebaume et al. | ...... | 427/249.1 |
| 7,250,147 B2 * | 7/2007 | Tour et al. | ...... | 423/447.1 |
| 7,304,103 B2 * | 12/2007 | Tour et al. | ...... | 523/468 |
| 7,364,648 B2 * | 4/2008 | Pinson et al. | ...... | 205/107 |
| 7,384,815 B2 * | 6/2008 | Tour et al. | ...... | 438/99 |
| 7,527,831 B2 * | 5/2009 | Tour et al. | ...... | 427/399 |
| 7,544,721 B2 * | 6/2009 | Gaud et al. | ...... | 522/151 |
| 7,572,426 B2 * | 8/2009 | Strano et al. | ...... | 423/447.1 |
| 7,812,139 B2 * | 10/2010 | Bidan et al. | ...... | 534/560 |
| 7,838,077 B2 * | 11/2010 | Tour et al. | ...... | 427/399 |
| 7,892,517 B2 * | 2/2011 | Tour et al. | ...... | 423/447.1 |
| 2002/0197467 A1 | 12/2002 | Johnson | | |
| 2007/0209943 A1 * | 9/2007 | Bureau | ...... | 205/317 |

FOREIGN PATENT DOCUMENTS

| | | |
|---|---|---|
| FR | 2 672 307 | 8/1992 |
| FR | 2 761 377 | 10/1998 |
| FR | 2 829 046 | 3/2003 |
| FR | 2 871 162 | 12/2005 |
| WO | WO 2006/000692 | 1/2006 |

* cited by examiner

*Primary Examiner* — Susan W Berman
(74) *Attorney, Agent, or Firm* — Young & Thompson

(57) ABSTRACT

The present invention relates to the use of a $R-N_2^+$ diazonium salt carrying an aromatic group R, for grafting of the aromatic group onto insulating, semiconductor, binary or ternary compound or composite material surfaces, the diazonium salt being present at a concentration close to its solubility limit, notably at a concentration higher than 0.05 M, and preferably varying between approximately 0.5 M to approximately 4 M.

14 Claims, 2 Drawing Sheets

METHOD FOR MODIFYING INSULATING OR SEMI-CONDUCTIVE SURFACES, AND RESULTING PRODUCTS

The object of the present invention is a method of modification of insulating or semiconductor surfaces or binary or ternary compounds, preferably by the grafting of an aromatic group derived from diazonium salt carrying the said aromatic group, as well as the products thus obtained.

Electro-grafting allows the functionalisation of surfaces conducting electricity. One of the considerable advantages of electro-grafting is that the energy, which allows both the formation of interface bonds and the growth of films, is brought to the surface: it is therefore the surface itself that generates its own purpose. The consequence of this property is, for example, that electro-grafted layers follow the topology of the surfaces on which they are created with great precision, even on nanometric scales. On the macroscopic scale, the consequence of this is also that electro-grafting allows coatings on parts having an arbitrary form of complexity with the same quality throughout: everywhere that the surface of the part is in contact with the electro-grafting solution, an electro-grafted film is formed, It is clearly impossible to carry out electro-grafting on the surface of insulators, at least in its habitual form, given that an insulator cannot be activated by electrical means.

With the aim of proposing functions of analogous quality on any type of surface, methods of grafting on insulators have to be updated, by seeking—either in the molecular precursors or in surface activation techniques—specific features that allow the elements observed for electro-grafting to be preserved: interface bond (covalent or not), conformity, homogeneity . . . .

The electrografting (eG™) of diazonium salts carried out on carbon (Pinson J., Podvorica F., *Chem. Soc. Rev,* 2005, 34, 429; Allongue P., Delamar M., Desbat B., Fagebaume O., Hitmi R., Pinson J., Savéant J. M., *J. Am. Chem. Soc.,* 1997, 119, 201; Liu Y. C., McCreery R. L., *J. Am. Chem. Soc.,* 1995, 117, 11254; Saby C., Ortiz B., Champagne G. Y., Bélanger D., *Langmuir,* 1997, 13, 6803), on metal (Adenier A., Bernard M.-C., Chehimi M. M., Deliry E., Desbat B., Fagebaume O., Pinson J., Podvorica F., *J. Am. Chem. Soc.,* 2001, 123, 4541; Bernard M. C., Chaussé A., Cabet-Deliry E., Chehimi M. M., Pinson J., Podvorica F., Vautrin-Ul C., *Chem. Mat.* 2003, 15, 3450; Marwan J., Addou T., Belanger D., *Chem. Mater.,* 2005; 17; 2395) and on semiconductors (Henry de Villeneuve C., Pinson J., Allongue P., *J. Phys Chem.,* 1997, 101, 2415) is only applicable to conductor or semiconductor surfaces. The spontaneous or thermal grafting (that is without electro-chemical or photochemical induction) of aryl groups on the surface of carbon has already been demonstrated (International Patent Applications WO 96/18688, WO 96/18690, WO 96/18674, WO 96/18695, WO 97/47692, WO 97/47698, WO 98/34960, WO 99/07794, WO 99 23,174, WO 0053681; et Brevets U.S. Pat. No. 5,672,198, U.S. Pat. No. 5,713,988, U.S. Pat. No. 5,698,016, U.S. Pat. No. 5,851,280, U.S. Pat. No. 5,885,355, U.S. Pat. No. 6,110,994).

The simple introduction of carbon black into a diazonium salt solution enables the surface of the carbon to be modified by attachment of aryl groups deriving from the diazonium salt. This spontaneous grafting reaction has been extended to metals and semiconductors, especially silicon (Bahr J. L. and Tour J. M., *Chem. Mater.,* 2001, 13, 3823; Bahr J. L., Yang J., Kosynkin D. V., Bronikowski M. J., Smalley R. E., Tour J. M., *J. Am. Chem. Soc.,* 2001, 123, 6536; Dyke C. A., Tour J. M., *J. Am. Chem. Soc.,* 2003, 125, 1156; Dyke C. A., Tour J. M., *Nano Letters,* 2003, 3, 1215; Strano M. C., Dyke C. A., Ursa M. L., Barone P. W., Allen M. J., Shan H., Kittrell C., Hauge R. H., Tour J. M., Smalley R. E., *Science,* 2003, 301, 1519; Fan F.-R., Yang J., Lintao C., Price D. W., Dirk S. M., Kosynkin D. V., Yao Y., Rawlett A. M., Tour J. M., Bard A. J., *J. Am. Chem. Soc.,* 2002, 124, 5550; United States patent application published on 5 Feb. 2004 with the number US 2004/0023479A1; Adenier A., Cabet-Deliry E., Chaussé A., Griveau S., Mercier F., Pinson J., Vautrin-Ul C., *Chem. Mat.,* 2005, 17, 491; Hurley B. L., McCreery R. L., *J. Electrochem. Soc.,* 2004, 15, B252-B259).

However, it has been observed that this spontaneous grafting occurred because the object, conductor or semiconductor is, in its open-circuit potential (the potential it adopts spontaneously when plunged into the diazonium salt solution), sufficiently reductive to reduce the diazonium salts spontaneously, according to the same mechanism as that observed during electrochemical reduction. The spontaneous grafting of diazonium salts on the surfaces is therefore a special case of electrochemical grafting, and therefore is only done for certain materials, which have a sufficiently cathodic open-circuit potential in a bath of diazonium salt. For these materials, grafting by electrochemical, and not just spontaneous, means only accelerates the grafting reaction produced in any event without electrochemical solicitation.

Besides, from this viewpoint it is observed that the reaction rates of spontaneous grafting of diazonium salts on the surfaces to their open circuit potential are slow: one hour or even more to be able to achieve a maximum rate of coverage on the surface.

Nonetheless, it would be quite interesting to be able to modify insulators such as organic polymers or the surfaces of oxides in the same way, which would enable their surface to be modified by giving them specific properties while still retaining the mechanical and electrical properties of the material.

U.S. Pat. No. 6,555,175 relates to a method for treatment of polymer compounds comprising the use of a diazonium salt. More precisely, this method relates to the thermal decomposition of concentrated solutions of diazonium salts formed in situ on the basis of amiphilic amines on aromatic polymers. This method does not include the use of reducers but requires a stage of heating the reagents to 70° C. Furthermore, the reaction time is approximately 8 hours, which poses a problem to the extent that decomposition of the diazonium salt takes place in a short period.

The object of the present invention is to furnish a method of grafting insulators by aryl groups derived from diazonium salts.

The object of the present invention is to furnish a method for the modification of insulator or semiconductor surfaces or binary or ternary compounds, comprising the use of grafting reactions of aryl groups, the kinetics of which are significantly faster than those of current methods.

The object of the present invention is also to furnish a method for modification of very resistant substrates, especially very resistant semiconductors or very resistant binary or ternary compounds, like what is obtained by electrochemical solicitation, but without having the inconveniences associated with the effects of ohmic drop for example.

The object of the present invention is also to furnish surfaces of composite materials having at least two of the materials selected from among insulating surfaces, semiconductor surfaces and binary or ternary compounds.

The present invention relates to the use of a diazonium salt R—$N_2^+$ bearing an aromatic group R, for the grafting of the said aromatic group onto insulator, semiconductor surfaces or binary or ternary compounds or composite materials, the said surfaces having a specific resistance greater than or equal to $10^{-5}$ Ω·m, and preferably greater than or equal to $10^{-3}$ Ω·m, the said diazonium salt being present at a concentration greater than 0.05 M, and varying preferably from approximately 0.5 M to approximately 4 M, and notably at a concentration close to its solubility limits in experimental conditions (solvent and temperature).

According to an advantageous production method, the diazonium salt is present at a concentration greater than 0.1 M.

It is specified that what is meant by "aromatic group R", is a radical derived from a cyclic compound comprising one or more independent or condensed benzene nuclei, and/or one or more complex nuclei derived from benzene. Naturally, this radical may also comprise heterocyclic nuclei and/or various substitutes, as well as hydrocarbon chain possibly comprising heteroatoms such as N, O and S.

The term "insulating surfaces" designates the surface of a material, which does not allow the passage of electrons or holes, and the resistivity of which is of the order of at least $10^{10}$ Ω·m. For example, polymers which are insulators have resistivity in the order of $10^{13}$ to $10^{15}$ Ω·m; thus, for the polyethylene used here, the resistivity is in the order of $10^{13}$ Ω·m and that of polypropylene is in the order of $10^{14}$ Ω·m.

The term "semiconductor surfaces" designates the surface of a semiconductor material, that is, of a material in which the current is carried by electrons and holes and the electrical conductivity of which, when it is very pure, increases exponentially with temperature and can be increased by several orders of magnitude from its intrinsic value by doping with electrically active impurities. Semiconductors are characterised by the size of the band gap that separates the valency band from the conduction band (L. I. Berger, B. R. Pamplin, Handbook of Chemistry and Physics, 84th edition, CRC Press; Boca Raton, p. 12-97).

The theoretical resistivity of intrinsic silicon, for example, is in the order of 3 Ω·m and depends on its purity. As regards the materials currently used in microelectronics, doping is located between $10^{15}$ et $10^{19}$ atoms/cm$^2$ and the resistivity subsequently depends on the type of doping (borium for p doping; arsenic, phosphor or antimony for n doping). Thus silicon, having n doping with arsenic ($10^{15}$ atoms/cm$^2$) has a resistivity of $3·10^{-2}$ Ω·m; silicon having n doping with arsenic ($10^{19}$ atoms/cm$^2$) has a resistivity of $4.4·10^{-5}$ Ω·m; silicon, having p doping with borium ($10^{15}$ atoms/cm$^2$) has a resistivity of $9·10^{-2}$ Ω·m and silicon, having p doping with borium ($10^{19}$ atoms/cm$^2$) has a resistivity of $9·10^{-5}$ Ω·m.

The term "binary or ternary compounds" designates binary or ternary compounds having different phases, for example Ta, TaN$_x$, TaSi$_x$N$_y$, TiN$_x$, TaSi$_x$N$_y$, WN$_x$, WC$_x$N$_y$ and WSi$_x$N$_y$. These compounds are widely used in the microelectronics industry, particularly in the method known by the methodname Damascene, which was described, for example, in Chang, C. Y. and Sze, S. M., 1996, "ULSI Technology" Mc Graw-Hill, New York. These compounds are deposited in thin layers by several methods such as PVD (Physical Vapor Deposition), CVD (Chemical Vapor Deposition) or ALD (Atomic Layer Deposition). These compounds are described, for example, in the following references: Kim, S-H.; Suk S.; Kim, H-M; Kang, D-H; Kim, K-B.; Li, W-M; Suvi, H.; Tuominen, M. *J. Electrochem Soc.*, 2004, 151, C272-C282 et H. B. Niel, S. Y. Xu, S. J. Wang, L. P. Youl, Z. Yang, C. K. Ong, J. Li, T. Y. F. Liew, *Appl. Phys. A,* 2001, 73, 229-236.

The thin layers mentioned above function particularly as a barrier to copper diffusion and/or migration or as electrodes for magnetic layers of data storage or as a grid material for CMOS transistors (Complementary Metal Oxide Semiconductors). The electrical resistivity of these thin layers is very highly dependent on the deposition conditions and spreads in a range from $2·10^{-3}$ Ω·m to $2·10^{-1}$ Ω·m. At the highest levels of resistivity of these thin layers, electrochemical grafting methods become inefficient because of the ohmic drop in the material. For example, the barrier layers of these materials used in the Damascene method have too high a resistivity to enable electrochemical deposition of homogenous copper on the plaquette scale.

The term "composite materials" designates composite materials having at least two of the materials selected from among insulating surfaces, semiconductor surfaces and binary or ternary compounds as defined above, given that the said composite materials are surface composites. The compound materials which can be cited, for example, include silicon surfaces comprising slices filled with copper (applications in microelectronics), substances in part comprising a dielectric material such as silicon or a binary compound such as TiN or TaN, organic polymer surfaces comprising certain metallic parts or hip replacements, the surface of which is composed of titanium or ceramic. Having a composite material comprising two materials of the same category, for example, a material comprising two different insulators or comprising two different semiconductors, can also be envisaged.

The term "concentration of diazonium salt close to its solubility limit" designates the concentration starting from which, at a given temperature and in a given solvent, the diazonium salt precipitates.

It is therefore sought to obtain the maximum concentration of diazonium salt such that, when a reducer is added or it is subjected to ultrasound, the maximum number of aryl radicals is produced, the majority of which will be lost in reactions in solution, but a smaller part of which will attack the surface. Within the limits of the method of the invention, the solubility limit can be exceeded.

If the concentration of the diazonium salt is too weak considering the reactivity of the radical and is therefore too far removed from the solubility limit of the said salt, the grafting reaction will not be efficient enough and the yield of that reaction will be very low.

The bonds formed on the polymers are $C_{aliphatic\ ou\ aromatic}$-$C_{aromatic}$ bonds whose energy is in the order of 400 kJ per mole.

Electrochemical grafting has been attributed to the formation of aryl radicals following transfer of an electron to the diazonium salt. The present invention is based on the homogenous formation of aryl radicals in a homogenous solution, either with the aid of a reducer, or by photochemistry of a charge transfer complex, or by activation by ultrasound. In the latter cases, the aryl radicals are not formed on the surface of the electrode it is hoped to modify as in the case of electrochemical reductions, they are produced within the solution and the major part of them reacts with the compounds in the solution. Only a small number of these radicals reacts with the surface to lead to its grafting. It is therefore necessary, as stated in the present application, to use high concentrations of diazonium salt to obtain sufficient concentrations of aryl radicals suitable for grafting to the surface.

The present invention also relates to the use as defined above, in which the grafted aromatic group derives from the reduction of the said diazonium salt, preferably by the use of a reducer of the said diazonium salt, by the photochemical irradiation of a charge transfer complex formed from the said diazonium salt, or by the treatment of the said diazonium salt with ultrasound.

The grafting of an aromatic group onto insulating surfaces or semiconductor surfaces or surfaces of binary or ternary compounds or surfaces of composite materials allows modified insulating surfaces or modified semiconductor surfaces or modified surfaces of binary or ternary compounds or surfaces of composite materials, that is surfaces onto which the said aromatic group is grafted to be obtained.

The term "reduction of diazonium salt" here designates the reaction leading to the aryl radical and the diazo compound by the formal transfer of an electron:

The term "charge-transfer complex" or "donor-recipient complex" designate a complex, that is the association of two chemical species and preferably of two molecules, in which these two species at least in part exchange a pair of electrons; the donor molecule donates either a pair of non-bonded electrons (n) or electrons π to a recipient molecule deficient in electrons, in this case diazonium salt. These charge transfer complexes are characterised in that their UV-visible spectrum differs from the sum of the spectra of the donor and recipient molecules. (J. March, Advanced Organic Chemistry, 4° edition, John Wiley, New York, p. 79).

The term "photochemical irradiation of a transfer of charges complex formed from the diazonium salt" designates the irradiation with visible or ultraviolet light (preferably ultraviolet) of a solution containing a recipient molecule, the diazonium salt and a donor molecule apt to form a charge transfer complex.

The term "treatment of the diazonium salt with ultrasound designates a method which consists in subjecting a diazonium salt solution to ultrasound.

By reducing using a homogenous reducer, which is a reducer dissolved in the same phase as the diazonium salt, a sufficiently concentrated solution of diazonium salt, a large quantity of free radicals is created. A part of the radicals produced homogenously in the solution reacts with a surface dipping in the solution. This therefore enables the surface of organic polymers or more generally insulators to be modified by aryl radicals, particularly by shearing off hydrogen atoms and coupling of radicals, by $S_H$ addition onto aromatics (Kochi, J. K. *Free Radicals* Vol. 1 and 2: New York, 1973) or by Merweein-type addition (Dombrovski *Russian Chem. Rev.* 1984, 53, 943; Rondestvedt *Org. React.* 1976, 24, 225) onto double bonds. It is also possible to have the radicals reacted with microelectronics substrates such as $SiO_2$.

Equally, by irradiating the charge-transfer complex, the transfer of electrons into this complex and the formation of aryl radicals is favoured Equally, by subjecting the diazonium salt solution to ultrasound, the reduction of the diazonium salt and the formation of the corresponding aryl radical is favoured.

The present invention relates to a method for modification of the surface of an insulating material, a semiconductor material, of a binary or ternary compound or a composite material, to obtain an insulating material, a semiconductor material, a binary or ternary compound or a composite material, the surface of which is modified by grafting aromatic groups onto the said surface, possibly substituted by functional groups, wherein the nature of the bond between the surface and the grafted aromatic bonds which modify it is a covalent bond, and notably such that it resists washing by ultrasound, the said method comprising placing the said surface in contact with a diazonium salt and the reduction of the said diazonium salt carrying the said aromatic group at a concentration close to its solubility limit, at a concentration greater than 0.05 M, and ranging preferably from approximately 0.5 M to 4 M, notably a concentration close to its solubility limit, notably by the use of a reducer, by the photochemical irradiation of a transfer of charges complex formed from the diazonium salt or by the treatment of the said diazonium salt by ultrasound, to obtain the said aromatic groups grafted onto the said surface.

According to an advantageous production method, the diazonium salt is present at a concentration greater than 0.1 M.

The term "functional groups" designates substitutes of the grafted aryl group, apt to react with molecules and capable of presenting particular properties.

According to the method of the present invention, the surface is modified such that the said method leads to the formation of bonds between the surface and the grafted aromatic groups corresponding to covalent bonds a carbon atom of the said aromatic group and an atom of the said surface.

According to a preferred embodiment, the method of the invention is characterised in that the period of contact of the surface and the diazonium salt is lower than approximately 60 minutes, and notable lasts approximately 1 to 60 minutes, and preferably approximately 1 to 10 minutes.

According to a preferred embodiment, the method of the invention is characterised in that the period of contact of the surface and the diazonium salt reduced by the use of a reducer or the photochemical irradiation of a complex of transfer of charges lasts approximately 1 to 10 minutes.

According to a preferred embodiment, the method of the invention is characterised in that the period of contact of the surface and the diazonium salt reduced by the use of ultrasound lasts approximately 10 to 60 minutes, and preferably approximately 20 minutes.

According to an advantageous embodiment, the method of the invention is characterised in that the diazonium salt answers the formula $ArN_2+X$, wherein Ar is the aromatic group and X is an advantageous anion beneficially selected from: halogens, sulphates, phosphates, perchlorates, tetrafluoroborates, carboxylates and hexafluorophosphates.

The anion can be a substitute of the aryl group, a sulphonate group for example, an amphiphilic molecule bearing a diazonium salt is then obtained.

The present invention also relates to a method as specified above, characterised in that the aromatic group is an aromatic residue in $C_6$-$C_{14}$, possibly substituted by one or more functional substitutes or a heteroaromatic residue of 4 to 14 atoms, possibly substituted by one or a plurality of functional substitutes, comprising one or a plurality of heteroatoms chosen from oxygen, hydrogen, sulphur and phosphor.

The present invention also relates to a method as specified above, characterised in that the aromatic group comprises one or a plurality of substitutes chosen in the group made up of:

linear or branched aliphatic radicals, of 1 to 20 carbon atoms, possibly comprising one or a plurality of double or triple bond(s), possibly substituted by carboxyl radicals, $NO_2$, di-substituted protected amino, mono-substituted protected amino, cyano, diazonium, alkoxy from 1 to 20 carbon atoms, alkoxycarbonyl from 1 to 20 carbon atoms, alkylcarbonyloxy from 1 to 20 carbon atoms, vinyl possibly fluorinated or allyl, hydrogen atoms, aryl radicals possibly substituted by carboxyl radicals, $NO_2$, di-substituted protected amino, mono-substituted protected amino, cyano, diazonium, alkoxy from 1 to carbon atoms, alkoxycarbonyl from 1 to 20 carbon atoms, alkylcarbonyloxy from 1 to 20 carbon atoms, vinyl possibly fluorinated or allyl, halogen atoms, carboxyl radicals, $NO_2$, di-substituted protected amino, mono-substituted protected amino, cyano, diazonium, sulfonic, phosphonic, alkoxy from 1 to 20 carbon atoms, alkoxycarbonyl from 1 to 20 carbon atoms, alkylcarbonyloxy from 1 to 20 carbon atoms, vinyl possibly fluorinated, halogen atoms, According to an advantageous embodiment, the method of the invention is characterised in that the aromatic group comprises one or a plurality of substitutes apt to react directly with organic resins, biological molecules chemical molecules or complexing agents, or one or a plurality of precursor substituents, which, after transformation, are apt to react with organic resins, biological molecules, chemical molecules or complexing agents.

The term "substitutes apt to react directly with polymers, chemical or biological molecules" designates substitutes of the aromatic group fixed onto the surface and having reactive functions apt to react with the chemical functions carried by other molecules. Examples of reactive functions brought by the aromatic group are allyl or vinyl or acetylene functions, halogens, alcohols of the type —$(CH_2)_n$—$CH_2$—OH, for example, carboxylic acids of type —$(CH_2)_n$—COOH, for example, acid anhydrides or halides, nitriles, isocyanates, amines, of the type —$(CH_2)_n$—$NH_2$, for example, n being a whole number ranging from 0 to 10, sulfonic acids, sulphonates, phosphonic acids, or phosphonates.

The term "precursor substituents, which, after transformation, are apt to react with polymers, chemical or biological molecules" designates substituents, which, after one or more transformation, are apt to react with polymers, biological molecules and chemical molecules. The precursor substituents, which, after transformation, are apt to react are: $NO_2$, $N_2^+$, $(CH_2)_n$—CN, $(CH_2)_n$—CHO, $(CH_2)_n$—$COOP_r$, $P_r$ being a protector group, —$(CH_2)_n$—$NHP'_r$, $(CH_2)_n$—$N(P'_r)_2$, $(CH_2)_n$—N=$P'''_r$, $P'_r$, $P'''_r$ being protector groups, n being a whole number from 1 to 10. Phenacyl chloride, sulphonyl or acetyl chloride are examples of amide protector groups.

The term "organic resin", designates polymers having reactive functions, for example functionalised styrene-co-divinylbenzene polymers (aminomethyl polystyrene, bromopolystyrene, hydroxymethyl polystyrene), used in combinational synthesis, the polymers used in peptide synthesis (for example Wang resin: polystyrene having alkoxybenzylalcohol functions).

The term "biological molecule" designates a molecule intervening in biological systems such as enzymes or antigens.

The term "chemical molecule" designates all molecules comprising functions apt to react with the functionalised aryl group: allyl or vinyl or acetylene groups, halogens, alcohols of the type —$(CH_2)_n$—$CH_2$—OH, for example, carboxylic acids of type —$(CH_2)_n$—COOH, for example, acid anhydrides or halides, nitriles, isocyanates, amines, of the type —$(CH_2)_n$—$NH_2$, for example, wherein n is a whole number ranging from 0 to 10, sulphonic acids or sulphonates, phosphonic acids, or phosphonates, or functions apt to react after transformation with an organic resin and chosen within the group constituted by $NO_2$, $N^{2+}(CH_2)_n$—CN, $(CH_2)_n$—CHO, $(CH_2)_n$—$COOP_r$, wherein $P_r$ is a protector group, —$(CH_2)_n$—$NHP'_r$, $(CH_2)_n$—$N(P'_r)_2$, $(CH_2)_n$—N=$P'''_r$, wherein $P'_r$, $P'''_r$ are protector groups, wherein n is a whole number ranging from 0 to 10 inclusive. Phenacyl chloride, sulphonyl or acetyl chloride are examples of amide protector groups.

The term "complexing agent" designates a molecule apt to complex metallic ions for example. EDTA (ethylenediaminotetracetic acid), amino-8 quinoline, crown ethers, cryptates and phenylalanine can be mentioned specifically.

The present invention also relates to a method as specified above, characterised in that the aromatic group comprises one or a plurality of substituents apt to react directly with an organic resin and chosen in the group constituted by allyl or vinyl or acetylene groups, halogens, alcohols of the type —$(CH_2)_n$—$CH_2$—OH, for example, carboxylic acids of type —$(CH_2)_n$—COOH, for example, acid anhydrides or halides, nitriles, isocyanates, amines, of the type —$(CH_2)_n$—$NH_2$, for example, wherein n is a whole number ranging from 0 to 10, sulphonic acids or sulphonates, phosphonic acids, or phosphonates, or one or a plurality of precursor substituents apt to react after transformation with an organic resin and chosen within the group constituted by $NO_2$, $N^{2+}(CH_2)$, —CN, $(CH_2)_n$—CHO, $(CH_2)_n$—$COOP_r$, wherein $P_r$ is a protector group, —$(CH_2)_n$—$NHP'_r$, $(CH_2)$, —$N(P'_r)_2$, $(CH_2)_n$—N=$P'''_r$, wherein $P'_r$, $P'''_r$ are protector groups, wherein n is a whole number ranging from 0 to 10 inclusive. Phenacylsulphonyl chloride or acetyl chloride are examples of amide protector groups.

A preferred method according to the present invention is a method as specified above, characterised in that the aromatic group comprises one or a plurality of substituents apt to react directly with a biological molecule and chosen in the group constituted by allyl or vinyl or acetylene groups, halogens, alcohols of the type —$(CH_2)_n$—$CH_2$—OH, for example, carboxylic acids of type —$(CH_2)_n$—COOH, for example, acid anhydrides or halides, nitriles, isocyanates, amines, of the type —$(CH_2)_n$—$NH_2$, for example, wherein n is a whole number ranging from 0 to 10, sulphonic acids or sulphonates, phosphonic acids, or phosphonates, or one of a plurality of precursor substituents apt to react after transformation with an organic resin and chosen within the group constituted by $NO^2$, $N^{2+}$, $(CH_2)_n$—CN, $(CH_2)_n$—CHO, $(CH_2)_n$—$COOP_r$, wherein $P_r$ is a protector group, —$(CH_2)$—$NHP'_r$, $(CH_2)_n$—$N(P'_r)_2$, $(CH_2)$, —N=$P'''_r$, wherein $P'_r$, $P'''_r$ are protector groups, wherein n is a whole number ranging from 0 to 10. Phenacylsulphonyl chloride or acetyl chloride are examples of amide protector groups.

According to an advantageous method of manufacture, the method of the present invention is characterised in that the aromatic group comprises one or a plurality of substituents apt to react directly with functional organic molecule and chosen in the group constituted by allyl or vinyl or acetylene groups, halogens, alcohols of the type —$(CH_2)_n$—$CH_2$—OH, for example, carboxylic acids of type —$(CH_2)$—COOH, for example, acid anhydrides or halides, nitriles, isocyanates, amines, of the type —$(CH_2)_n$—$NH_2$, for example, wherein n is a whole number ranging from 0 to 10, sulphonic acids or sulphonates, phosphonic acids, or phosphonates, or one or a plurality of precursor substituents apt to react after transformation with an organic resin and chosen within the group constituted by $NO_2$, $N_2^+$, $(CH_2)$, —CN, $(CH_2)_n$—CHO, $(CH_2)_n$—$COOP_r$, wherein $P_r$ is a protector group, —$(CH_2)$, —$NHP'_r$, $(CH_2)$—$N(P'_r)_2$, $(CH_2)$—N=$P'''_r$, wherein $P'_r$, $P'''_r$ are protector groups, wherein n is a whole number ranging from 0 to 10. Phenacylsulphonyl chloride or acetyl chloride are examples of amide protector groups.

The present invention also relates to a method as specified above, characterised in that the diazonium salt is chosen from:

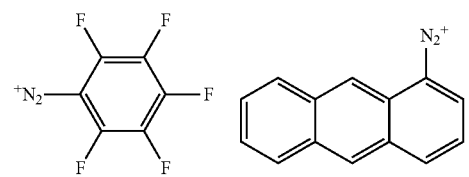

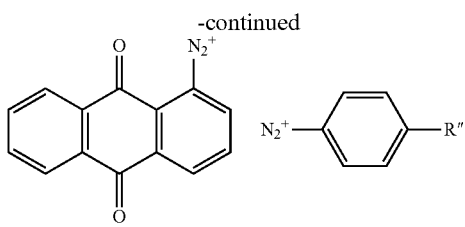

wherein R" is chosen from the following groups: —CH$_3$, n-C$_4$H$_9$, n-C$_{12}$H$_{25}$, —OC$_{12}$H$_{25}$, —OC$_{16}$H$_{33}$, Cl, —Br, —I, —CH$_2$Br, —CH(CH$_3$)Br, —CH$_2$—O—C(=O)CH(CH$_3$)Br, —CH$_2$—O—C(=O)C(CH$_3$)$_2$Br, —OH, —CH$_2$ OH, —SH, —CH$_2$ CH$_2$SH, —CHO, —COCH$_3$, COOH et 3,4-(COOH)$_2$, 3-COOH-4-NO$_2$, 3,4-(C(=O)F)$_2$, —CH$_2$ COOH, —CH$_2$ CH$_2$COOH, —COOC$_2$H$_5$, —NHC(=O)Ot-Bu, —NHC(=O)CH$_3$, —NHC(=O)CF$_3$, CH$_2$ CH$_2$ NH$_3^+$, —CN and 3,4-(CN)$_2$, 3 et 4-NO$_2$, pyrrolyl, o-hydroxybenzoic, 2-(2-thiophen-3-yl-acetyl)-aminoethyl, 4-benzoylbenzene, 4-(2,5-dioxo-2,5-dihydro-pyrrol-1-yl), 3-isonitrile, le 3-dioxo-1H-isochromene-5-diazonium-3H-benzo[de]chromene-5-diazonium, 3-(2,5-dioxo-2,5-dihydro-pyrrol-1-yl) and 4-[1-(2,2,6,6-tetramethyl-piperidine-1-yloxy)]-ethyl.

The present invention also relates to a method as specified above, characterised in that the diazonium salt is a diazoresine.

The term "diazoresine" designates a polymer obtained by condensation of formaldehyde with diazonium salts, and preferably with diazonium salts of substituted or non-substituted diphenylamine. These diazoresines are compounds used industrially as a photosensitive layer in the manufacture of plate for printing. (Zhao C., Chen J. Y., Cao, W. X., *Angewandte Makromolekulare Chemie*, 1998, 259, 77-82; U.S. Pat. No. 6,165,689).

The present invention also relates to a method as specified above, characterised in that the insulating material is organic in nature and chosen from:

the following aromatic polymers: polycarbonate (PC), phenylene polysulphide (PPS), polyphenylene ether (PPE), le polyetherether ketone (PEEK), polyethylene terephthalate (PET), polyether sulphone (PES), aromatic polyamide (PPA), bisphenol polythene terephthalate (PAR), polyetherimide (PEI), polyamide-imide (PAI, Torlon®), le polypyromellitide (Kapton®), polystyrène (PS), poly(4-méthylstyrène), poly(4-vinylpyridine)(4VP) or poly(2-vinylpyridine)(2VP), polyvinylcarbazole, and the following aliphatic polymers: polyethylene (PE), polypropylene (PP), polyisobutylene (P-IB), polymethylpentene, polyvinyl chloride (PVC), polyvinyl acetate (PVAC), polyvinyl butyral (PVB), polyvinyl formal (PVFM), polymethyl methacrylate (PMMA), polyvinyl alcohol (PVAL), polyethylene terephthalate (PET), polybutylene terephthalate (PBT), different polyamides, polyoxometalates (POM), cellulose derivatives and polyacrylonitrile (PAN).

The present invention also relates to a method as specified above, characterised in that the insulating material or the binary or ternary compound is chosen from: Whether doped or not, AsGa, SiO$_2$, SiC, TiN, TaN, TaN/Ta and WCN.

The present invention also relates to a method as specified above, characterised in that it includes the use of a reducer.

The term "reducer" designates a compound apt to supply an electron to an oxidant.

According to an advantageous means of manufacture of the method of the invention, the reducer is chosen from: reducers having oxidation potentials close to 0 V/SCE or negative, hypophosphorous acid, halide salts, notably sodium iodide, ferrocene and its derivatives, notably ferrocene-methanol or carboxylic ferrocene acid, ascorbic acid, dimethylaminoborane, sodium borohydride, viologene salts, notably methyl- or benzoviologene and phenolates, notably bisphenolates.

According to an advantageous embodiment, when the method of the invention includes the use of a reducer, the said method is characterised in that it includes placing the surface in contact with the diazonium salt and the reducer, the said reducer being present in stoichiometric quantity or greater than stoichiometry relative to the said diazonium salt.

According to an advantageous embodiment, when the method of the invention includes the use of a reducer, the said method is characterised in that it is carried out in an aqueous solution or in an aprotic solvent chosen from: acetonitrile, dimethylformamide, benzonitrile, butyronitrile, diméthylsulfoxyde, tetrahydrofurane, dioxane and acetamide.

The present invention also relates to a method as specified above, characterised in that it comprises of the photochemical irradiation of a transfer of charges complex formed from diazonium salt.

According to a preferred embodiment, the method of the invention comprises of the formation of a transfer of charges complex by reacting diazonium salt and an electron-donor aromatic compound, and irradiation of the said transfer of charges complex, to achieve the reduction of the diazonium salt and the formation of aryl radicals which bond to the said surface.

According to a preferred embodiment, the method of the invention comprises of the photochemical irradiation of a transfer of charges complex formed from diazonium salt and is characterised in that it comprises the following steps:

placing the surface in contact with the diazonium salt and an electron-donor aromatic compound, to obtain a transfer of charges complex, and irradiation, notably by photochemistry, of the said transfer of charges complex, to obtain the reduction of the diazonium salt and the formation of aryl radicals which bond to the said surface.

According to a preferred embodiment, the method of the invention as specified above, comprising the photochemical irradiation of a transfer of charges complex formed from diazonium salt, is characterised in that the electron-donor aromatic compound derives from the surface to be modified, wherein the said surface is an aromatic polymer chosen from: polycarbonate (PC), phenylene polysulphide (PPS), polyphenylene ether (PPE), polyetherether ketone (PEEK), polyethylene terephthalate (PET), polyether sulphone (PES), aromatic polyamide (PPA), bisphenol polythene terephthalate (PAR), polyetherimide (PEI), polyamide-imide (PAI, Torlon®), polypyromellitide (Kapton®), polystyrene (PS), poly(4-methylstyrene), poly(4-vinylpyridine)(4VP) or poly(2-vinylpyridine)(2VP), polyvinylcarbazole.

According to a preferred embodiment, the method of the invention as specified above, comprising the photochemical irradiation of a transfer of charges complex formed from diazonium salt, is characterised in that it is carried out in an aprotic solvent chosen from: acetonitrile, dimethylformamide, benzonitrile, butyronitrile, dimethylsulphoxide, tetrahydrofurane, dioxane and acetamide.

According to a preferred embodiment, the method of the invention as specified above, comprising of the photochemical irradiation of a transfer of charges complex formed from diazonium salt, is characterised in that the electron-donor aromatic compound is chosen from: 1,4-dimethoxybenzene, le toluene, le p-xylene, le mesitylene, le naphtalene, l'anthracene, le pyrene, le p-dimethoxybenzene and p-diethoxybenzene.

According to an advantageous embodiment, the method of the invention as specified above, comprising the photochemical irradiation of a transfer of charges complex formed from diazonium salt, is characterised in that the diazonium salt is chosen from: 4-bromobenzene diazonium, 4-iodobenzene diazonium and 4-diazoniumbenzoic acid.

The present invention also relates to a method as specified above, characterised in that it includes the use of ultrasound.

According to a preferred embodiment, the method of the invention as specified above is characterised in that it includes a stage of placing the surface in contact with the diazonium salt and treatment with ultrasound.

According to another preferred embodiment, the method of the invention as specified above is characterised in that it includes a single stage during which the material is plunged into the diazonium-salt solution irradiated with ultrasound.

According to an advantageous embodiment, the method of the invention as specified above, comprising of the use of ultrasound, is characterised in that it is carried out in an aqueous acid medium, in ethyl alcohol and in an aprotic solvent chosen from: acetonitrile, dimethylformamide, benzonitrile, butyronitrile, dimethylsulphoxide, tetrahydrofurane, dioxane and acetamide.

The present invention also relates to modified surfaces of an organic or inorganic insulating material or an inorganic semiconductor material or a binary or ternary compound or composite material, obtained by utilisation of the method as defined above.

The method of the invention enables the preparation of modified surfaces of polymers or inorganic compounds, the structure and internal composition of which are independent of those of the surface. Specific properties can therefore be given to the surface. For example, polymers can be prepared, the mechanical properties of which are provided by the chemical nature of the aliphatic or aromatic chains and the surface of which has adjustable functions dependent on the intended use of the application (biomedical, supported drugs . . . ). The method of the invention also enables inorganic materials to be prepared having organic functions and being fit for use as a sensor or specific layer in microelectronics.

According to a particularly advantageous embodiment, the surfaces modified according to the invention are characterised in that the aromatic group grafted is apt to undergo further functionalisation reactions.

The term "further functionalisation reactions" designates, for example, the reaction of coupling, onto the initially grafted layer, a molecule having the pharmacological action, for example, of an anti-inflammatory, an antibiotic, an antimitotic, an enzyme, a complexing agent, a polymer or dye, but also (in the case of inorganic substrates), complexing molecules that can be used in the manufacture of sensors.

EXPERIMENTAL PART

Figure 1:
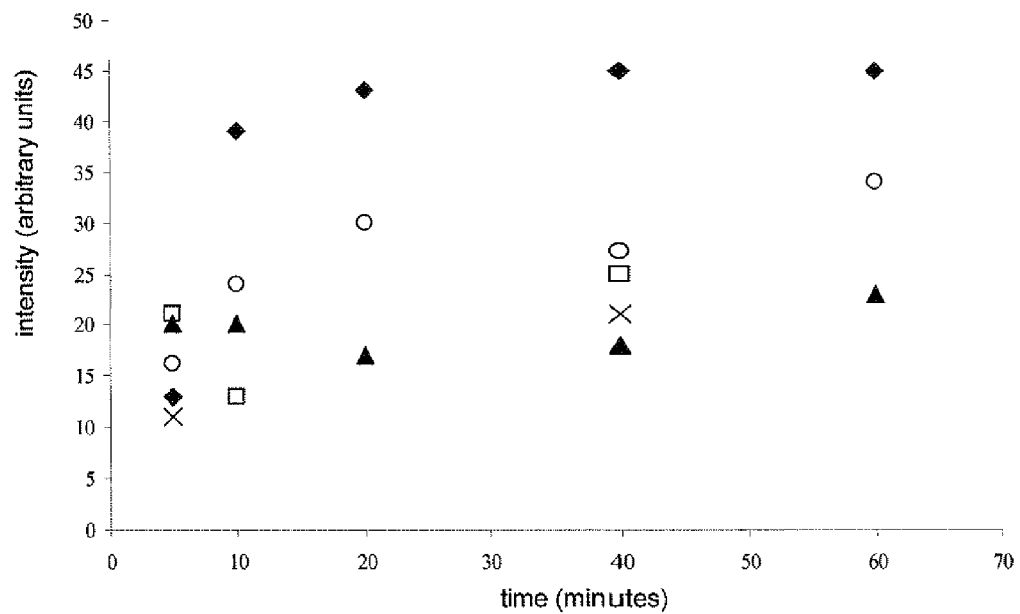
FIG. 1 relates to the grafting of polypropylene (PP) under ultrasound by 4-trifluorobenzenediazonium. It represents the variation in intensity of the $CF_3$ band over time. Series 1 (black diamonds), 2 (white squares), 3 (black triangles) and 4 (black crosses) correspond respectively to the variation of the bands of PP grafted by the groups $C_6H_4CF_3$ at 1340, 1160, 1070 and 997 $cm^{-1}$. Series 5 (black roundels) corresponds to the mean of the other series.

In the present application aromatic groups are grafted onto polymers using reduction by homogenous reducers, by photochemistry or by activation by ultrasound.

Grafting tests in the absence of activation (reaction blanks) were carried out beforehand, clearly showing that activation is indispensable for diazonium salts to be able to react on polymers or dielectrics.

TABLE 1

Grafting test without activation of 4-nitrobenzene diazonium

| Substrate | Solvent | | |
|---|---|---|---|
| | ACN | $H_2SO_4$ 0.1N | EtOH |
| $PE^{a)}$ | $none^{b)}$ | $none^{c)}$ | $none^{c)}$ |
| PP $none^{a)}$ | $none^{b)}$ | $none^{c)}$ | $none^{c)}$ |
| Kapton ®$^{a)}$ | $none^{b)}$ | $none^{c)}$ | $none^{c)}$ |
| $PET^{a)}$ | $none^{b)}$ | $none^{c)}$ | $none^{c)}$ |
| $PEEK^{a)}$ | $none^{b)}$ | $none^{c)}$ | $none^{c)}$ |
| Teflon ®$^{a)}$ | $none^{b)}$ | $none^{c)}$ | $none^{c)}$ |
| $ABS^{a)}$ | $none^{b)}$ | $none^{c)}$ | $none^{c)}$ |
| $SiO_2^{d)}$ | $\epsilon^{b)d)}$ | — | — |
| $TiN^{d)}$ | $\epsilon^{b)d)}$ | — | — |

$^{a)}$IR search of the bands characteristic of the chemical function —$NO_2$ after having left the polymer in contact with the solution for one hour, followed by rinsing with water then acetone under ultrasound, "none" means that these IR bands are not detected;
$^{b)}$c = 0.22M;
$^{c)}$saturated solution c ≦ 0.22M;
$^{d)}$at the detection limit of ToF-SIMS, the intensity of the characteristic peaks is close to that of the untreated sample.

On the other hand, reactions were carried out at weaker concentrations than those used in the present application: the results in Table 2 effectively show that high concentrations have to be used to be able to detect grafting.

TABLE 2

Grafting test at a weak concentration of 4-nitrobenzene diazonium

| Substrates | Solvent Concentration | Activation | Result |
|---|---|---|---|
| PP | ACN | Ultrasound[a] | None[b] |
| PET | 10 mM | | |
| Kapton ® | | | |
| PET | ACN | Photochemistry[c] | None[b] |
| | 10 mM | | |
| PET | ACN | Reduction by ferrocenemethanol[d] | None[b] |
| | 10 mM | | |
| PET | $H_2SO_4$ 0.1N | Reduction by iodide[e] | None[b] |
| $SiO_2$ | ACN | Ultrasound | ε[g] |
| | 10 mM | | |
| TiN | ACN | Ultrasound | ε[g] |
| | 10 mM | | |

[a] 1 hour of irradiation;
[b] the bands characteristic of the chemical function —$NO_2$ are not detected by IR;
[c] Irradiation for 15 minutes with a 150 W lamp in the presence of 11 nM of toluene used to form a charge transfer complex.
[d] Solution 10 mM, reaction time 5 minutes;
[e] Solution 10 mM, reaction time 15 minutes.
[g] at the detection limit of ToF-SIMS, the intensity of the characteristic peaks is close to that of the untreated sample.

The formation of radicals from diazonium salts is the basis of the de-diazotisation reaction. It can be done heterolytically (formation of $Ar^+$) or homolytically (formation of $Ar^°$). It is this latter reaction that it is sought to favour (Galli, C. Chem. Rev. 1988, 88, 765).

The production of radicals by reducers and by photochemistry from charge transfer complexes is based on the publication by J. K. Kochi (D. Kosynkin, T. M. Bockman, J. K. Kochi, J. Am. Chem. Soc., 119, 4846, (1997)), which showed that the radicals obtained by the homogenous reduction of diazonium salts coupled with the aromatic compound used as the solvent according to an $S_H$ homolytic aromatic substitution reaction.

$ArN_2^+ + Ar'H \rightarrow Ar—Ar' + H^+ + N_2$

In the absence of aromatic compounds used as the solvent, the same radicals react partly with the solvent and partly with the (surface) polymer, either by adding themselves to the aromatic groups or double bonds, or by stripping a hydrogen atom from the polymer to form a radical likely to couple with an aryl radical.

A diagram of the first reaction is shown below:

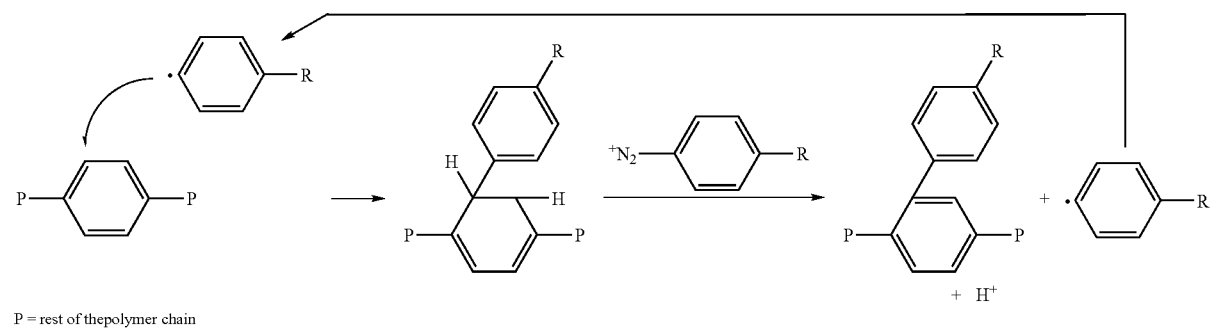

P = rest of the polymer chain

It is an $S_H$ homolytic aromatic substitution followed by the re-oxidation of the intermediate cyclohexadienyle radical by the diazonium salt. It is the same reaction which ensures the growth of polyphenylene layers during the grafting of diazonium salts onto carbon or metal (Combellas, C.; Kanoufi, F.; Pinson, J.; Podvorica, F. Langmuir 2005, 21, 280).

The addition of an aromatic radical to a double bond is a reaction known in the art, it is the Merweein reaction (Dombrovski, Rondestvedt, cited above)

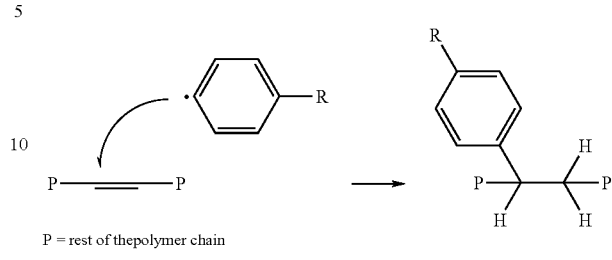

P = rest of the polymer chain

The stripping of a hydrogen atom from the polymer followed by the coupling of two radicals can be written as follows:

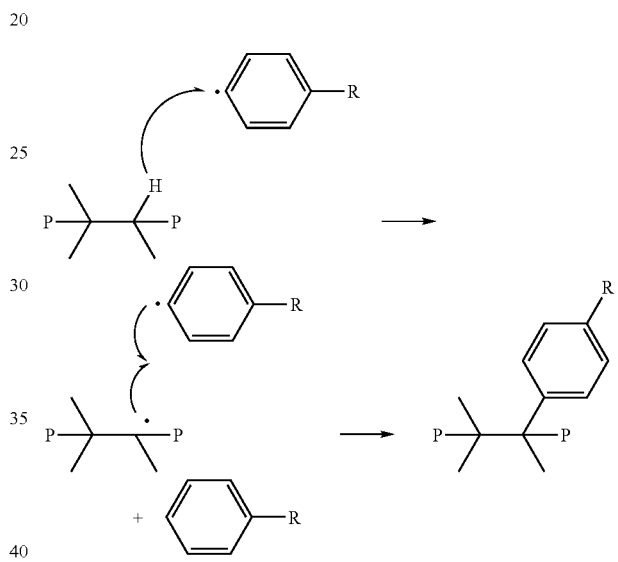

The mechanism of formation of radicals by ultrasound is described in various reviews (Cravotto, G.; Cintas, P. Chem. Soc. Rev. 2006, 35, 180 and references cited). The formation of radicals from diazonium salts has been used to trigger polymerisations (Cheung, M. H.; Gaddam, K. J. Appl. Polym. Sci. 2000, 76, 101; Vivekanandam, T. S.; Govalan, A.; Vasudevan, T.; Umapathy, S. Polymer 1999, 40, 807.)

P=rest of the polymer chain
Surfaces used:
 PP: polypropylene foil (supplier Goodfellow)
 PET: polymethyl terephthalate foil (supplier DSM)
 PEEK: polyetheretherketone foil (supplier Goodfellow)
 PE: very high molecular weight polyethylene (supplier Goodfellow)
 Teflon: polytetrafluoroethylene (supplier Goodfellow)
 ABS: acrylonitrile-butadiene-styrene* (supplier Goodfellow)
  * obtained by dispersing a grafted elastomer phase (butadiene) in a styrene-acrylonitrile (SAN) co-polymer phase
 Kapton® polyimide (supplier Dupont)
 Polyamide (balloon stents)
 TiN, SiC, SiOC, $SiO_2$
Diazonium salt: Tetrafluoroborate of 4-bromobenzene diazonium (Aldrich)
I—Reduction by Homogenous Reducers The two reducers described by J. K. Kochi (Kosynkin D., Bockman T. M., Kochi J. K., *J. Am. Chem. Soc.*, 1997, 119, 4846) were used: NaI and Ferrocenemethanol ($FeCH_2OH$). More generally, other reducers are possible for example hypophosphite (Panduragappa, M., N., S. Lawrence, R., G. Compton, *Analyst*, 2002, 1568-1571) or ascorbic acid (Costas-Costas, U.; Bravo-Diaz, C.; Gonzalez-Romero, E. *Langmuir* 2004, 20, 1631) and more generally all the compounds, the redox potential of which is more positive than that of diazonium salt (that is more negative than 0.5V/SCE such as to reduce all the diazonium salts.

Example 1

Use of NaI as Reducer

A sample of a surface to be modified is placed in a test tube. Moreover two solutions are prepared
 1—14 ml of acetonitrile (ACN)+1.12 g of 4-bromobenzenediazonium (1.47 M)
 2—14 ml of acetonitrile (ACN)+0.609 g of NaI (1.47 M)
This experiment is performed at concentrations very close to the solubility limit of 4-bromobenzenediazonium.

2 ml of solution 1 is added to each test tube then 2 ml of solution 2. The mixture of these two solutions is homogenised by plunging the test tube into an ultrasound vessel for one second. A violent release of nitrogen is observed, the mixture foams. The mixture turns brown ($I_2$). It is left to rest for 1 hour. The samples are rinsed with water under ultrasound (10 minutes), twice in acetone (for analysis) (10 minutes) and dried in a vacuum for 18 hours.

TABLE 3

ToF-SIMS analysis of polymers grafted by 4-bromophenyl groups.

| Surfaces: | Peaks (Intensity*) | Attribution |
|---|---|---|
| PP | 79-81 (0.3 $10^4$) | $Br^-$ |
|  | 127 ((2 $10^3$) | $I^-$ |
| PET | 79-81 (1 $10^4$) | $Br^-$ |
|  | 139-141 (0.5 $10^4$) | $[OCH_2CH_2O + Br]^-$ |
|  | 167-169 (2 $10^3$) | $[O{=}COCH_2CH_2O + Br]^-$ |
|  | 213 | $[O{=}COCH_2CH_2O + I]^-$ |
| PEEK | 79-81 (1.5 $10^4$) | $Br^-$ |
|  | 127 (0.4 $10^4$) | $I^-$ |
| TiN | 79-81 (2 $10^4$) | $Br^-$ |
|  | 127 (6 $10^4$) | $I^-$ |
| SiC | 79-81 (2 $10^4$) | $Br^-$ |
|  | 127 (3.5 $10^4$) | $I^-$ |
| SiOC | 79-81 (0.3 $10^3$) | $Br^-$ |
|  | 127 (1 $10^2$) | $I^-$ |

TABLE 3-continued

ToF-SIMS analysis of polymers grafted by 4-bromophenyl groups.

| Surfaces: | Peaks (Intensity*) | Attribution |
|---|---|---|
| $SiO_2$ | 79-81 (0.8 $10^3$) | $Br^-$ |
|  | 127 (1 $10^3$) | $I^-$ |

*Arbitrary units

The presence of bromine on the surface of the polymers and even brominated fragments of the polymer PET clearly show that the diazonium reacts with the surface of the polymers and dielectrics. Moreover, the presence of iodine can be seen on the surface, which indicates that iodine atoms derived from the NaI reducer have reacted on the surface.

Example 2

Use of Ferrocenemethanol ($FeCH_2OH$) as Reducer

A sample of a surface to be modified is placed in a test tube. A solution is then prepared
 1—14 ml of acetonitrile (ACN)+0.39 g of 4-bromobenzenediazonium (0.1 M)
 2—14 ml of acetonitrile (ACN)+0.30 g of $FeCH_2OH$ (0.1 M)

2 ml of solution 1 is added to each test tube then 2 ml of solution 2 (final concentration 0.05 M). The mixture formed by these two solutions is homogenised by plunging the test tube into an ultrasound vessel for five minutes. A release of nitrogen is observed. The mixture passes from orange to deep green. It is left to rest for 1 hour. The samples are rinsed twice in acetone (for analysis) (10 minutes) and dried in a vacuum for 18 hours.

TABLE 4

ToF-SIMS analysis of polymers grafted by 4-bromophenyl groups.

| Sample | Peaks (Intensity*) | Attribution |
|---|---|---|
| PP | 79-81 (0.6 $10^4$) | $Br^-$ |
| PET | 79-81 (1 $10^4$) | $Br^-$ |
|  | 93-95 (3 $10^3$) | $CH_2Br$ |
|  | 125-127 (3 $10^3$) | $[BrCOOH_2]^-$ |
|  | 139-141 (56 $10^3$) | $[BrCH_2COOH_2]^-$ |
|  | 153-155 (1 $10^3$) | $[BrCH_2CH_2COOH_2]^-$ |
| PEEK | 79-81 (1.5 $10^4$) | $Br^-$ |
| TiN | 79-81 (3 $10^5$) | $Br^-$ |
| SiC | 79-81 (0.6 $10^4$) | $Br^-$ |
| SiOC | 79-81 (2 $10^3$) | $Br^-$ |
| $SiO_2$ | 79-81 (0.5 $10^4$) | $Br^-$ |

*Arbitrary units

The presence of bromine on the surface of the polymers and even brominated fragments of the polymer PET clearly show that the diazonium reacts with the surface of the polymers and dielectrics.

Example 3

—$C_6H_4COOH$ groups have been grafted by reduction of corresponding diazonium tetrafluoroborate by ferrocene methanol according to the following operational method.
 The following is prepared:
  a) a solution of 175 mg $BF_4^{-+}N_2C_6H_4COOH$ in 7.5 ml of ACN (c=0.1 M); and
  b) a solution of 162 mg ferrocenemethanol ($FeCH_2OH$) in 7.5 ml ACN (c=0.1 M).

Firstly, 2.5 ml of solution a) is added to a haemolysis tube containing a sample of polymer (see Table 3), then 2.5 ml of solution b) (final concentrations 50 mM of $^+_2NC_6H_4COOH$ and 50 mM of $FeCH_2OH$): the mixture of these two solutions turns dark green and bubbles of nitrogen are released. The mixture is then placed in ultrasound for minutes. The samples are rinsed under ultrasound in acetone (10 minutes), water (10 minutes) and ACN for analysis (10 minutes).

TABLE 5

IR analysis of polymers grafted by 4-carboxyphenyl groups.

| Sample | IR band[1] cm$^{-1}$ | Attribution | 4-aminobenzoic acid[2] cm$^{-1}$ |
|---|---|---|---|
| PP | 1687 | C=O | 1658 |
|  | 1617 | Cycle vibration | 1599 |
| PET | 1681[3] | C=O | 1658 |
| PEEK | /[4] | / |  |

[1] after subtraction of the polymer spectrum
[2] solid
[3] projection on the ester band of the PET
[4] the C=O bands of the PEEK and the $C_6H_4COOH$ group are too close to be distinguished.

The contact angles of the water were also measured before and after treatment by the reducer:

TABLE 6

Contact angles of samples grafted by diazonium salt of 4-aminobenzoic acid.

| Sample | Angle of contact before treatment | Angle of contact after treatment |
|---|---|---|
| PP[a] | 124 | 114 |
|  |  | 72 (after 10 minutes) |
|  |  | 69 (after 20 minutes) |
| PET | 90 | 62 |
| PEEK | 87 | 55 (after 10') |

[a] the angle takes some time to attain a limit value without notable evaporation of the drop.

The presence of IR bands corresponding to the C=O group and the aromatic cycle plus the more hydrophilic nature of the surface give proof of the grafting of the phenylcarboxylic group to the surface.

Example 4

Use of Hypophosphorous Acid as Reducer

Hypophosphorous acid has been used to reduce diazonium salts (Pandurangappa et al., 2002, cited above; Miklukhin, G. P.; Rekasheva, A. F.; Pisarzhevskii, L. V. *Doklady Akad. Nauk.*, 1952, 85, 82; Kornblum, N.; Kelley, A. E.; Cooper, G. D. *J. Am. Chem. Soc.*, 1952, 74, 3074) and preferably in the presence of carbon black, which allows the surface of the carbon black to be modified by the aryl groups deriving from diazonium.

Into three haemolysis tubes each containing a sample of polymer (PP, PET, PEEK foil), 190 mg of 4-iodobenzenediazonium tetrafluoroborate (final concentration 0.15 M) is placed then 4 ml of 50% hypophosphorous acid in aqueous solution (final concentration 0.15 M) is added. The tubes are placed in an ultrasound vessel for 10 minutes to homogenise the mixture; the diazonium salt dissolves progressively. At the end of the reaction a precipitate is formed and an oily surface-floating liquid and a strong aromatic odour are observed, probably indicating the formation of iodobenzene (Miklukhin et al., 1952—cited above). The samples are rinsed under tap water, then twice in distilled water (10 minutes under ultrasound) and finally in acetonitrile for analysis (10 minutes under ultrasound). They are dried in a vacuum at 40° C.

TABLE 7

IR spectrum of samples treated by 4-iodobenzene diazonium tetrafluoroborate

| Sample | IR band[1] cm$^{-1}$ | Attribution | 4-iodobenzene diazonium |
|---|---|---|---|
| PP | 1541 | Cycle vibration | 1548 |
|  | 812 | CH outside the plane | 825 |
|  |  |  | 757 |
| PET | 1532 | Cycle vibration |  |
|  | 845 | CH outside the plane |  |
| PEEK | 1562 | Cycle vibration |  |
|  | 825 | CH outside the plane |  |

[1] after subtraction of the polymer spectrum

TABLE 8

ToF-SIMS spectrum of samples treated by 4-iodobenzene diazonium tetrafluoroborate

| Sample | Peaks (Intensity*) | Attribution |
|---|---|---|
| PP | 127 (2.5 10$^3$) | I$^-$ |
|  | 205 (6 10$^1$) | [$C_6H_5I$ + H]$^-$ |
|  | 231 (1 10$^1$) | [$CH_2CH_2C_6H_4I$]$^-$ |
| PET | 127 (4 10$^3$) | I$^-$ |
|  | 214 (2 10$^2$) | C—$C_6H_3$—I$^-$ |
|  | 228 (0.5 10$^2$) | 214 + $CH_2^-$ |
|  | 242 (0.5 10$^2$) | 228 + $CH_2^-$ |
|  | 256 (0.5 10$^2$) | 242 + $CH_2^-$ |
|  | 351 (2 10$^1$) | $C_6H_5(C=O)OCH_2CHC_6H_4I^-$ |
| PEEK | 127 (3.5 10$^3$) | I$^-$ |
|  | 254 (3.5 10$^1$) | $I_2^-$ |

The presence of IR bands corresponding to the aromatic group as well as iodised organic fragments clearly demonstrates the grafting of the iodophenyl group.

Example 5

The same reducer is used to reduce 4-bromobenzene diazonium in the presence of PE, Teflon and ABS. Into three test tubes each containing a sample of polymer, 272 mg of 4-bromobenzene tetrafluoroborate is placed and 5 ml of hypophosphorous acid (50% solution in water) is added. The final diazonium concentration is 0.2 M. The tubes are placed in an ultrasound vessel for 10 minutes to homogenise the mixture. The final solution is cloudy, with a strong aromatic odour. The samples are rinsed abundantly in hot water under the tap then twice in distilled water for 10 minutes under ultrasound, then for 10 minutes in acetone (PP, Teflon) or isopropanol (ABS) under ultrasound. They are then dried in a vacuum at 40° C.

TABLE 9

IR spectrum of polymer samples (PE, Teflon, ABS) modified by bromophenyl groups

| Sample | IR band[1] cm$^{-1}$ | Attribution | 4-bromobenzene diazonium |
|---|---|---|---|
| PE | 1555 | CH outside the plane | 1555 |
|  | 843 | Id | 826 |
|  | 763 |  | 764 |
| Téflon | 1548 | Cycle vibration |  |
|  | 852 | CH outside the plane |  |
|  | 758 | Id |  |

TABLE 9-continued

IR spectrum of polymer samples (PE, Teflon, ABS) modified by bromophenyl groups

| Sample | IR band[1] cm$^{-1}$ | Attribution | 4-bromobenzene diazonium |
|---|---|---|---|
| ABS | 1584 | Cycle vibration | |
| | 824 | CH outside the plane | |
| | 744 | Id | |

[1] after subtraction of the polymer spectrum

TABLE 10

ToF SIMS spectrum of polymer samples (PE, Teflon, ABS) modified by bromophenyl groups*.

| Sample | Peaks (Intensity*) | Attribution |
|---|---|---|
| PE | 79-81 | Br$^-$, Br$^+$ |
| | 104-106 | CH$_3$—CH$_2$Br$^-$ |
| | 179-181 | C$_2$C$_6$H$_4$Br$^-$ |
| | 197-199 | (CH$_2$)$_3$C$_6$H$_4$Br$^-$ |
| | 225-227 | (CH$_2$)$_5$C$_6$H$_4$Br$^-$ |
| | 264-266 | not attributed |
| | 290-292 | not attributed |
| | 183-185 | (CH$_2$)$_2$C$_6$H$_4$Br$^+$ |
| | 265-267 | (CH$_2$)$_6$—CH=CH—C$_6$H$_4$Br$^+$ |
| Teflon | 79-81 | Br$^-$ (weak) |
| ABS | 79-81 | Br$^-$, Br$^+$ |
| | 191-193 | C$_3$—C$_6$H$_4$Br$^+$ |

*Only the fragments containing bromine are indicated, located by two peaks of approximately equal height and separated by two units of mass.

The infrared and ToF-SIMS spectra do indicate the existence of grafting, especially the fragments comprising bromophenyl groups

Example 6

This same method has been used to modify the surface of binary or ternary compounds ((TiN: 20 nm thick), TaN, TaN/Ta (tantalum deposited in a 10 nm layer on nm of TaN)) and of dielectrics (SiC, SiOC, SiO$_2$) used in microelectronics. Into five test tubes containing samples of TiN, TaN, SiC, SiOC, SiO$_2$ respectively, 270 mg of trifluoromethyl benzene diazonium tetrafluoroborate is added (which corresponds to a final concentration of 0.2 M. Into each tube is added 5 ml of H$_2$PO$_3$ (50% aqueous solution), it is shaken in an ultrasound vessel for 5 minutes; at the end an oil floats on the surface of the aqueous solution. The samples are washed in hot tap water, twice in distilled water under ultrasound for 10 minutes and once in acetone under ultrasound and finally dried in a vacuum at 40° C.

TABLE 11

ToF-SIMS spectra of dielectrics and binary or ternary compounds modified by trifluoromethyl pheny groups.

| Sample | m/z | Interpretation |
|---|---|---|
| TaN/Ta | 19 | F$^-$ |
| | 69 | CF$_3^-$ |
| | 145 | C$_6$H$_4$CF$_3^+$ |
| | 160 | N—C$_6$H$_4$CF$_3^-$ |
| TiN and SiC | 19 | F$^-$ |
| | 69 | CF$_3^-$ |
| | 145 | C$_6$H$_4$CF$_3^{+\ et\ -}$ |
| SiOC | 19 | F$^-$ |
| | 69 | CF$_3^-$ |
| | 145 | C$_6$H$_4$CF$_3^+$ |
| | 197 | C—C Si—C$_6$H$_4$CF$_3^-$ |
| | 304 | O—C$_6$H$_3$CF$_3$—C$_6$H$_4$CF$_3^-$ |
| | 317 | Si—C$_6$H$_3$CF$_3$—C$_6$H$_4$CF$_3^-$ |
| | 473 | C—Si—C$_6$H$_3$CF$_3$—C$_6$H$_3$CF$_3$—C$_5$H$_4$CF$_3^-$ |
| SiO$_2$ | 19 | F$^-$ |
| | 69 | CF$_3^-$ |
| | 145 | C$_6$H$_4$CF$_3^{+\ et\ -}$ |
| | 283 | (HOSiO)—SiO$_2$—O—C$_6$H$_4$CF$_3^-$ |

The ToF-SIMS spectra confirm the grafting of trifluoromethylphenyl (the presence of trifluoromethylphenyl fragments should be noted particularly) on the surface of the dielectrics, but the presence of phosphoric acid residues clearly visible on the spectra should be noted.

II—Reduction of Charge Transfer Complexes by Photochemical Irradiation

In the article by Kosynkin et at. (1977) (already cited) J. K. Kochi shows that diazonium salts (pentafluorobenzenediazonium and 2,4,6-trichloro-3,5-difluorobenzene-diazonium, that is diazonium salts carrying electro-attractive chemical groups making them more easily reducible) form charge transfer complexes with electron-rich aromatics such as naphthalene or 1,4-dimethoxybenzene characterised by absorptions in the visible wavelength. The irradiation of these complexes produces an excited state in which an electron transfer from the aromatic to the diazonium salt takes place, which leads to the formation of aryl radicals, which, in the case of the cited publication, react with the aromatic solvent to lead to biphenyls. This reaction has been transposed to obtain the reaction of aryl radicals with the surfaces of our substrates.

Example 7

Formation and Irradiation of a Charge Transfer Complex Between 4-Bromobenzendiazonium and 1,4-Dimethoxybenzene Two solutions are prepared:

1—in 14 ml ACN, 1.12 g of 4-bromobenzenediazonium (0.30 M)

2—in 14 ml ACN, 0.57 g of 1,4-dimethoxybenzene (0.30 M)

The samples are placed in a test tube and 2 ml of each solution is added; the golden-yellow colour corresponding to the formation of the charge transfer complex is observed.

The solution is then deposited on the samples, left to evaporate and introduced into a Fisons irradiation tunnel (H lamp). Five passages are carried out (belt speed 2 cm/s, or approximately 40 s of irradiation). The deposition and irradiation are repeated twice and terminated with 10 passages in the tunnel. The samples are carefully rinsed twice in acetone then twice in acetonitrile for analysis (still under ultrasound) then dried in a vacuum at 40° C. for 16 hours.

TABLE 12

ToF-SIMS analysys of polymers, binary or ternary compounds and dielectrics modified by photochemistry of charge transfer complexes.

| Sample | Peaks (Intensity*) | Attribution |
|---|---|---|
| PP | 79-81 (1.5 $10^5$) | $Br^-$ |
|  | 91-93 (1 $10^3$) | $CBr^-$ |
|  | 103-105 (0.5 $10^3$) | $CH_2CH_2Br$ |
| PET | 79-81 (1 $10^4$) | $Br^-$ |
|  | 93-95 (0.8 $10^4$) | $[CH_2Br]^-$ |
| PEEK | 79-81 (1 $10^5$) | $Br^-$ |
| TiN | 79-81 (0.5 $10^4$) | $Br^-$ |
| SiC | 79-81 (7 $10^4$) | $Br^-$ |
| SiOC | 79-81 (1.5 $10^3$) | $Br^-$ |
| $SiO_2$ | 79-81 (0.2 $10^3$) | $Br^-$ |

*Arbitrary units

The presence of bromine on the ToF-SIMS spectrum is quite compatible with the grafting of 4-bromophenyl groups to the surface.

Example 8

Formation and Irradiation of a Charge Transfer Complex Between the Diazonium Salt of 4-Aminobenzoic Acid and 1,4-Dimethoxybenzene Three samples of polymers are taped to a glass plate and a solution containing 0.4 M of diazonium salt of 4-aminobenzoic acid and 0.4 M of 1,4-dimethoxybenzene in acetonitrile (ACN) (the final concentration is therefore 0.2 M) is deposited on these samples using a pipette. The solution wets the PEEK well, the PET averagely and the PP very badly (the solution has to be spread constantly allowing the ACN to evaporate). After 5 passes in the irradiation tunnel (Fisons, H mercury lamp) or approximately 20 seconds of irradiation, the solutions are entirely evaporated under the heat of the lamp. Rinsing is carried out in acetone and twice in ACN (for analysis) under ultrasound for minutes and drying takes place in a vacuum at 40° C.

TABLE 13

IR analysis of polymers grafted by 4-carboxyphenyl groups.

| Sample | IR band[1] $cm^{-1}$ | Attribution | 4-aminobenzoic acid[2] $cm^{-1}$ |
|---|---|---|---|
| PP | 1686 | C=O | 1658 |
| PET | ≈1681[3] | C=O | 1658 |
| PEEK | /[4] | / |  |

[1] after subtraction of the polymer spectrum.
[2] solid.
[3] projection
[4] the C=O bands of the PEEK and the $C_6H_4COOH$ group are too close to be distinguished.

The contact angles of the water were also measured before and after treatment by the transfer of charges complex:

TABLE 14

Contact angles of samples grafted by the diazonium salt of 4-aminobenzoic acid.

| Sample | Angle of contact before treatment | Angle of contact after treatment |
|---|---|---|
| PP[a] | 124 | 123 |
|  |  | 72 (after 10 minutes) |
|  |  | 70 (after 20 minutes) |
| PET | 90 | 79 |
| PEEK | 87 | 58 |

[a] the angle takes some time to attain a limit value without notable evaporation of the drop.

The presence of the C=O bands of the carboxyphenyl groups and the more hydrophilic nature of the surface demonstrate well the grafting of the carboxyphenyl chemical group.

Example 9

Grafting of Bromophenyl and Trifluorophenyl Groups by Irradiating the Surface in the Presence of Diazonium Salts In the preceding example an electron-rich aromatic was added to the irradiated solution to form the charge transfer complex. In this example, the aromatic compound has been left out so that the polymer itself (PEEK, PET, ABS, electron-rich) can be used to form the charge transfer complex.

On two samples of each of these PEEK, PET, ABS polymers, a saturated solution of 4-bromobenzenediazonium in $H_2SO_4$ 0.1N is deposited and on the other a saturated solution of 4-trifluoromethylbenzenediazonium in $H_2SO_4$ 0.1N. These samples are irradiates in a tunnel under a mercury vapour lamp (1H-lamp) for approximately 100 seconds. The samples are abundantly washed in hot water then twice in distilled water under ultrasound for 10 minutes then in acetone under ultrasound for 10 minutes and dried in a vacuum.

TABLE 15

ToF-SIMS analysis of samples modified by bromo- or trifluoromethylphenyl groups.

| Sample | m/z | Attribution |
|---|---|---|
| PEEK + 4-bromobenzenediazonium | 79, 81 | $Br^-$ |
|  | 158, 160, 162 | $Br_2^-$ |
|  | 171, 173 | $O-Br^-$ |
| PEEK + 4-trifluoromethylbenzenediazonium | 19 | $F^-$ |
|  | 145 | $C_6H_4CF_3^-$ |
| PET + 4-bromobenzenediazonium | 79, 81 | $Br^-$ |
| PET + 4-trifluoromethylbenzenediazonium | 19 | $F^-$ |
|  | 69 | $CF_3^-$ |
|  | 145 | $C_6H_4CF_3^-$; $C_6H_4CF_3^+$ |

TABLE 15-continued

ToF-SIMS analysis of samples modified by bromo- or trifluoromethylphenyl groups.

| Sample | m/z | Attribution |
|---|---|---|
| ABS + 4-bromobenzenediazonium | 79, 81 | $Br^-$ |
| ABS + 4-trifluoromethylbenzenediazonium | 19 | $F^-$ |
|  | 69 | $CF_3^-$ |
|  | 145 | $C_6H_4CF_3^-$ |
|  | 345 | $CH_3$—$CH(C_6H_4CF_3)$—$CH_2CH(C_6H_4CF_3)$ |

The presence of bromine and trifluoromethylphenyl groups is characteristic of the grafting of bromophenyl and trifluoromethylphenyl groups onto the surface of the polymers.

III—Use of Ultrasound

Surfaces used:
PP: polypropylene foil (supplier Goodfellow)
PET: polyethylterephthalate foil (supplier DSM)
PEEK: polyetheretherketone foil (supplier Goodfellow)
TiN, SiC, SiOC, $SiO_2$ Diazonium salt:
Tetrafluoroborate of 4-bromobenzene diazonium (Aldrich)
Tetrafluoroborate of 4-bromobenzene diazonium (Aldrich)
4-aminobenzoic acid diazonium tetrafluoroborate (Alchimer)
4-bromobenzene diazonium tetrafluoroborate (Alchimer)

The ultrasound vessel used is Sonorex Super RK 103H vessel of 2×320 W power used at half power; its frequency is 35 kHz.

The use of power ultrasound (Power Ultrasound (20 at 100 KHz) can activate or trigger chemical reactions and this method has been the subject of a recent review (Cravotto, G.; Cintas, P. *Chem. Soc. Rev* 2006, 35, 180). The chemical effects of ultrasound are associated with the phenomenon of cavitation, which produces high temperatures and pressures locally. One of the results of this phenomenon is the formation of radicals. Thus, the radicals obtained from azo-bi-sisobutyronitrile and peroxydisulphate have been used to trigger the polymerisation of acrylamide (Cheung, M. H.; Gaddam, K. *J. Appl. Polym. Sci.* 2000, 76, 101). The decomposition of diazonium salts has been observed by spin-trapping experiments (Rehorek, D.; Janzen, E. G. *J. Prakt. Chem.* 1984, 326, 935). The radicals deriving from the decomposition of diazonium salts and peroxides have been used to modify the surface of polymers and dielectrics.

Example 10

Grafting of Polypropylene by Nitrophenyl Groups

Into a test tube containing a sample of polypropylene (PP), 25 mL ACN and 1 g of 4-nitrobenzene diazonium tetrafluoroborate (c=0.16 M) is introduced and left under ultrasounds for 1 hour 10 minutes. The sample is carefully rinsed in acetone under ultrasound for 10 minutes then in methanol (for analysis). XPS analysis of the sample shows the presence of a N1s peak at 402 eV, which probably corresponds to nitrogen of the nitro group (—$NO_2$), which has been reduced in amine under the X-ray beam, as has been frequently observed (P. Mendes, M. Belloni; Ashworth; C. Hardy; K. Nikitin; D. Fitzmaurice; K. Critchley; S. Evans; J. Preece *Chem. Phys. Chem.* 2003, 4, 884).

Example 11

Grafting of Polymers and Microelectronics Substrates by Bromophenyl Groups—Solution in Acetonitrile Under the same conditions as above, polymer surfaces, binary or ternary compound surfaces and insulating surfaces (SiC, $SiO_2$, SiOC) in microelectronics are treated all at once using 4-bromobenzene diazonium tetrafluoroborate salt.

TABLE 16

ToF-SIMS analysis of samples grafted by 4-bromobenzene diazonium

| Surfaces: | Peaks (Intensity*) | Attribution |
|---|---|---|
| PP | 79-81 (3 $10^3$) | $Br^-$ |
| PET | 79-81 (1 $10^4$) | $Br^-$ |
|  | 93-95 (0.5 $10^4$) | $CH_2Br$ |
| PEEK | 79-81 (3 $10^4$) | $Br^-$ |
| TiN | 79-81 (6 $10^5$) | $Br^-$ |
| SiC | 79-81 (0.8 $10^5$) | $Br^-$ |
| SiOC | 79-81 (2 $10^3$) | $Br^-$ |
| $SiO_2$ | 79-81 (4 $10^5$) | $Br^-$ |

*arbitrary units

The presence of bromine proves grafting of the bromophenyl group to the surface.

Example 12

Grafting of the Surface of Polymers by Bromophenyl Groups. Reaction in Aqueous Solution A 0.2 M solution of 4-bromobenzene diazonium tetrafluoroborate in $H_2SO_4$ 0.1 M) (practically saturated solution) is distributed between five test tubes containing samples of polymer (PP, PET, PEEK, PE, Teflon, ABS). The tubes are placed in an ultrasound vessel for 1 hour. The samples are rinsed with hot tap water, twice in distilled water under ultrasound (10 minutes) and in acetone or isopropanol (ABS) and finally dried in a vacuum.

TABLE 17

IR analysis of polymers surface-modified by bromophenyl groups.

| Sample | IR band[1] $cm^{-1}$ | Attribution | 4-bromobenzene diazonium |
|---|---|---|---|
| PET | 1551 (projection) | Cycle vibration | 1555 |
|  |  |  | 1460 |
|  | 837 | CH vibration | 826 |
|  | 758 | outside the plane | 756 |
| PEEK | 1553 | Cycle vibration |  |
|  | 1465 |  |  |
|  | 830 | CH vibration |  |
|  | 759 | outside the plane |  |

TABLE 17-continued

IR analysis of polymers surface-modified by bromophenyl groups.

| Sample | IR band[1] cm$^{-1}$ | Attribution | 4-bromobenzene diazonium |
|---|---|---|---|
| PE | 1551 | Cycle vibration | |
| | 852 | CH vibration | |
| | 739 | outside the plane | |
| Teflon | 1551 | Cycle vibration | |
| | 810 | CH vibration | |
| | 756 | outside the plane | |
| ABS | 1550 sh | Cycle vibration | |
| | 824 | CH vibration | |
| | | outside the plane | |

[1] after subtraction of the polymer spectrum

TABLE 18

ToF-SIMS analysis of samples grafted by 4-bromobenzene diazonium, under ultrasound in an aqueous solution*

| Substrate | Peaks | Attribution |
|---|---|---|
| PE | 79-81 | Br$^-$ |
| | 91 | $C_6H_5CH_2^-$ |
| | 295 | $CH_3-(CH_2)_{20}^-$ |
| | 371 | $CH_3-(CH_2)_{20}-C_6H_4$ |
| | 79-81 | Br$^+$ |
| | 339-341 | $CH_3-(CH_2)_{12}-C_6H_4Br + 1$ |
| PP | 79-81 | Br$^-$ |
| | 91 | $C_6H_5CH2^-$ |
| | 231-233 | $C_6H_4-C_6H_4Br^-$ |
| | 255-257 | $C_2-C_6H_4-C_6H_4Br^-$ |
| | 277-279 | $(CH_2)_3C_6H_6-C_6H_6Br^-$ |
| | 336 | $(CH_2)_{24}^-$ |
| | 487-489 | $(CH_2)_2-(C_6H_4)_4-C_6H_4Br^-$ |
| | 79-81 | Br$^+$ |
| | 91 | $C_6H_5CH2^+$ (ion tropylium) |
| | 175-177 | $CH_2C_6H_{10}-Br$ |
| | 254-256 | $C_2-C_6H_4-C_6H_4Br^+ - 1$ |
| PET | 79-81 | Br$^-$ |
| | 93-95 | $CH_2Br^-$ |
| | 247-249 | $CH_2-C_6H_4-C_6H_4Br^- + 2$ |
| | 261-263 | $CH_2-CH_2-C_6H_4-C_6H_4Br^- + 2$ |
| | 606-607-608 | $[C_6H_4COO(CH_2)_2OOCC_6H_4CO + 2\,C_6H_4Br]^-$ |
| | 79-81 | Br$^+$ |
| | 167-169 | $C-C_6H_4Br^+$ |
| | 267-269 | $C_3-C_6H_4-C_6H_4Br^+$ |
| PEEK | 79-81 (3 10$^4$) | Br$^-$ |
| | 121-123 | $CH_2COBr^+$ |
| | 261-263 | $C_6H_5-(CO)-C_6H_4Br^+$ |
| | 606-607-608-609 | $3\,C_6H_5Br^+$? |
| Teflon ® | 79-81 traces | Br$^-$ |
| ABS | 79-81 | Br$^-$ |
| | 195-197 | $CH_2(CN)C_6H_4Br^-$ |
| | 221-223; 223-225 | $221-223 = 195-197 + 26\,(CN)$ |
| | 155-157 | $C_6H_4Br^+$ |

*Are not indicated except the peaks corresponding to brominated products characterised by the presence of two bromine isotopes 79 and 81 (having two peaks very close in height and separated by two peaks of relative height 1/2/1 where two bromine atoms are present).

The IR and ToF-SIMS spectra very clearly prove the presence of the bromophenyl group grafted to the surface.

Example 13

Grafting of Polymers by Carboxyphenyl Groups. Solution in Acetonitrile

A sample of polymer (PP, PET or PEEK) is immersed in a 4-aminobenzoic acid diazonium tetrafluoroborate solution (1.4 g; solubility limit –0.4 M in acetonitrile (15 mL)) and left for one hour under ultrasound; at the end of the irradiation, the temperature reaches 45° C. The samples are rinsed in acetone under ultrasound for 10 minutes, in distilled water under ultrasound (10 minutes) and finally in acetonitrile for analysis under ultrasound (10 minutes). The samples are then analysed by IR.

TABLE 19

IR analysis of samples grafted by the diazonium salt of 4-aminobenzoic acid.

| Sample | IR band[1] cm$^{-1}$ | Attribution | 4-aminobenzoic acid[2] cm$^{-1}$ |
|---|---|---|---|
| PP | 1687 | C=O | 1658 |
| | 1612 | Cycle vibration | 1599 |
| PET | 1680[3] | C=O | 1658 |
| PEEK | /[4] | / | |

[1] after subtraction of the polymer spectrum;
[2] solid;
[3] projection on the ester band of the PET;
[4] the C=O bands of the PEEK and the $C_6H_4COOH$ group are too close to be distinguished.

TABLE 20

Contact angles of samples grafted by the diazonium salt of 4-aminobenzoic acid.

| Sample | Angle of contact before treatment | Angle of contact after treatment |
|---|---|---|
| PP | 124 | 125 |
| | | 82 (after 10')[b] |
| | | 82 (after 20')[b] |
| PET | 90 | 75 |
| PEEK | 87 | 55 |

[b] without notable diminution in the size of the drop.

The presence of C=O and aromatic bands in IR plus the more hydrophilic nature of the surface prove the grafting of the 4-carboxyphenyl group.

Example 14

Grafting of Polymers by Anthraquinone Groups. Solution in Acetonitrile

Three polymer samples (PP, PET, PEEK) in a saturated solution of acetonitrile (<0.1 M) of Fast Red AL salt, the formula of which is given below. After one hour under ultrasound, the samples are rinsed in water, acetone, then in distilled water under ultrasound for 10 minutes, then in acetone, then acetonitrile for analysis The samples are then examined by IR.

TABLE 21

IR analysis of samples modified by the Fast Red AL salt

1/2 ZnCl$_2$
Fast Red AL Salt

| Sample | IR band[1] cm$^{-1}$ | Attribution | |
|---|---|---|---|
| PP | 1749 vw | C=O | 1749 for the Fast Red |
| | ≈1367 vw | | 1367 for the Fast Red |
| | ≈1219 vw | | 1219 for the Fast Red |
| PET | ≈1749 vw | C=O | 1749 for the Fast Red |
| PEEK | 1749 vw | C=O | 1749 for the Fast Red |
| | 1371 vw | | 1367 for the Fast Red |
| | ≈1167 vw | | 1164 for the Fast Red |

[1] after subtraction of the polymer peak itself.

Although weak, it is possible in three cases to see the C=O band of the Fast Red Al salt, proving its grafting well.

Example 15

Grafting of Polymers by Trifluoromethylphenyl Groups. Grafting Variation Dependent on Reaction Time Five tubes each containing a sample of PP are prepared, the same is done for PET and PEEK samples. 45 ml of 0.15 M solution of 4-trifluoromethylphenylbenzene diazonium in acetonitrile are prepared, which are distributed among the 15 tubes at the rate of 3 ml per tube. The tubes are immediately placed in the ultrasound vessel. Three samples (PP, PET, PEEK) are taken after 5, 10, 20, 40 and 60 minutes to examine the variation in the rate of grafting over time. The samples are washed twice in acetone (10 minutes under ultrasound) then in acetonitrile (10 minutes under ultrasound) and dried in a vacuum at 40° C.

The samples are then examined by IR spectroscopy.

TABLE 22

IR analysis of samples modified by 4-trifluoromethylphenyl benzene diazonium

| $_2$HN—C$_6$H$_4$—CF$_3$ | $^+_2$N—C$_6$H$_4$CF$_3$ BF$_4^-$ [a] | PP[c] | PET | PEEK | Attribution |
|---|---|---|---|---|---|
| 3052 | 3055 | | [d] | | Aromatic C—H elongation |
| 1626 | 1636 | | [d] | | Vibration of the aromatic cycle |
| 1527 | | 1559 | [d] | | Vibration of the aromatic cycle |
| 1441 | 1426 | 1452 | [d] | | Vibration of the aromatic cycle |
| 1319 | 1320 | 1340 | | | CF$_3$ |
| 1185 | 1180 | 1222 | | | CF$_3$ |
| 1157 | 1138 | 1160 | | | CF$_3$ |
| 1061 | [b] | 1070 | | | CF$_3$ |

TABLE 22-continued

IR analysis of samples modified by 4-trifluoromethylphenyl benzene diazonium

| $_2$HN—C$_6$H$_4$—CF$_3$ | $^+_2$N—C$_6$H$_4$CF$_3$ BF$_4^-$ [a] | PP[c] | PET | PEEK | Attribution |
|---|---|---|---|---|---|
| 829 | 852 | 844 | | | CH vibration outside the plane 1,4-disubstitution |

[a] the band corresponding to the diazonium function appears at 2307 cm$^{-1}$.
[b] Hidden by the large band corresponding to the BF$_4^-$ ions.
[c] After subtraction of the polymer spectrum itself.
[d] the bands corresponding to the substituents cannot be distinguished from those of the polymer itself.

Figure 2:
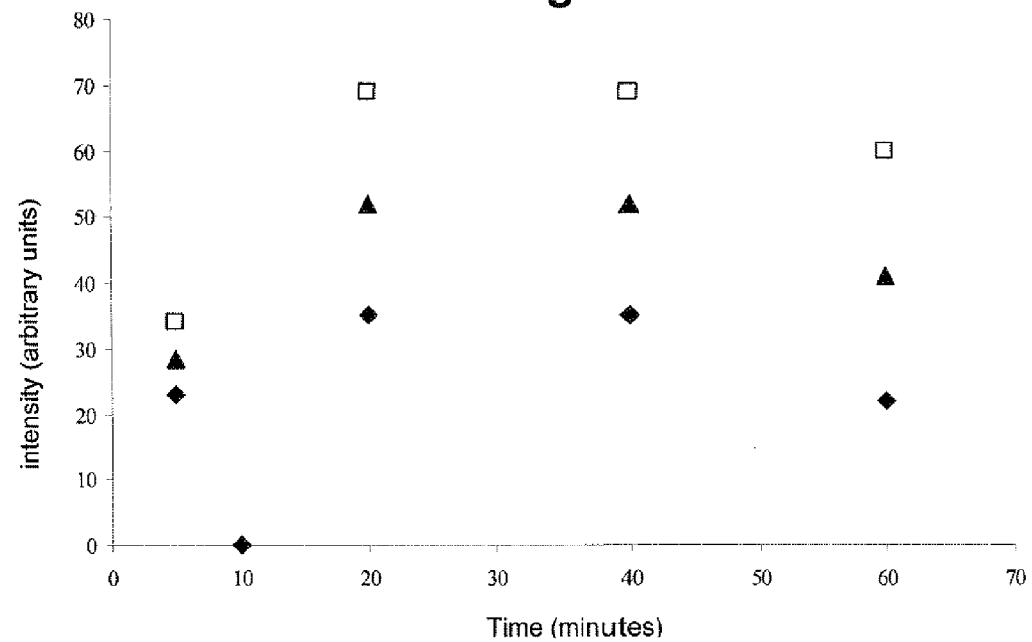
FIG. 2 relates to the grafting of polyethylene (PET) under ultrasound by 4-trifluorobenzenediazonium. It represents the variation in intensity of the $CF_3$ band over time. Series 1 (black diamonds), 2 (white squares), corresponds respectively to the variation of the bands of PET grafted by the groups $C_6H_4CF_3$ at 1337 and 1102 $cm^{-1}$ and series 3 (black triangles) corresponds to the mean of series 1 and series 2.
Figure 3:
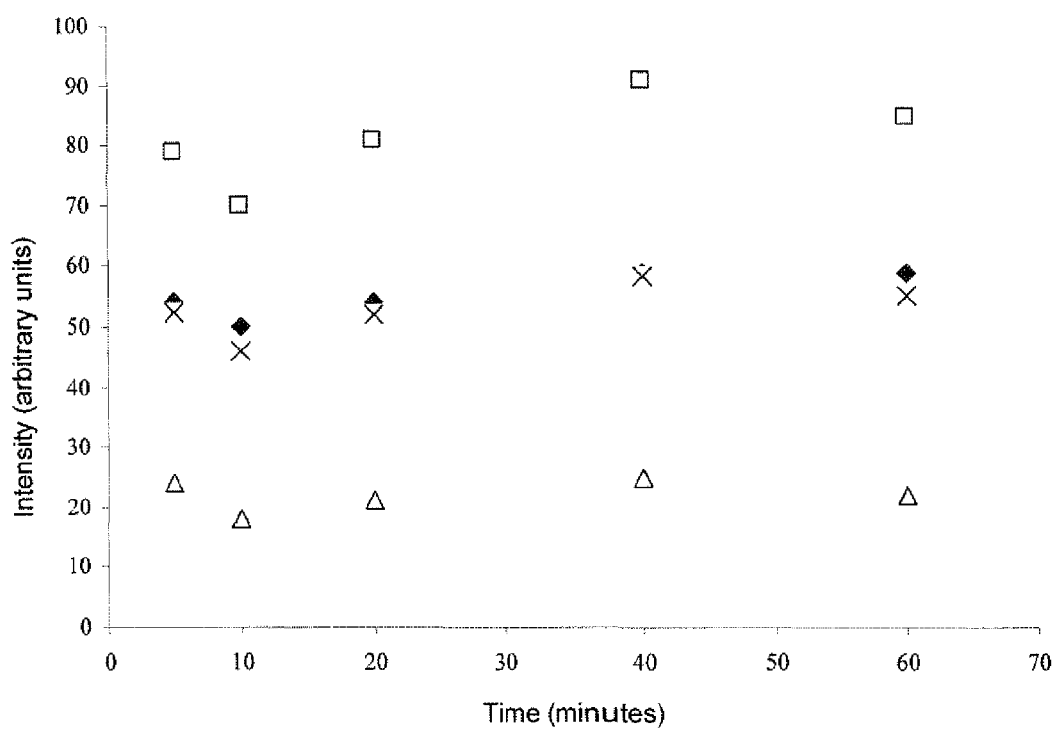
FIG. 3 relates to the grafting of polyetherether (PEEK) under ultrasound by 4-trifluorobenzenediazonium. It represents the variation in intensity of the $CF_3$ band over time. Series 1 (black diamonds), 2 (white squares) and 3 (black triangles) corresponds respectively to the variation of the bands of PEEK grafted by the groups $C_6H_4CF_3$ at 1309, 1160 and 1099 $cm^{-1}$. Series 4 (black crosses) corresponds to the mean of the preceding series.

The spectra agree with the grafting of the trifluoromethylphenyl groups. The intensities of the —CF$_3$ bands over time have been traced in FIGS. 1, 2 and 3 in order to follow the grafting kinetics.

The similarity in the variation in intensity of the different CF$_3$ bands indicates that the variation observed is not due to an artefact. The mean of the variation of these intensities reaches a limit value after 20 minutes. This period of irradiation with ultrasound is therefore sufficient to obtain maximum grafting.

Example 16

Grafting in an Aqueous Solution of Binary or Ternary Compounds and Inorganic Dielectrics by Trifluoromethylphenyl Groups Into five test tubes containing a sample of TiN, TaN, SiC, SiOC, SiO$_2$ respectively, 260 mg of 4-trifluoromethyl benzene diazonium (final concentration 0.2 M; saturated solution) is added, then 5 ml of H$_2$SO$_4$ 0.1N. It is left for an hour under ultrasound. The samples are washed in hot water, twice for 10 minutes in distilled water under ultrasound, once for 10 minutes in acetone under ultrasound and dried in a vacuum at 40° C.

TABLE 23

ToF-SIMS analysis of binary or ternary compounds and inorganic dielectrics modified by trifluoromethyl phenyl groups.

| Substrate | m/z | Interpretation |
|---|---|---|
| TaN | 69 | CF$_3^-$ |
| | 145 | C$_6$H$_4$CF$_3^+$ |
| | 160 | NHC$_6$H$_4$CF$_3^-$ |
| TiN | 69 | CF$_3^-$ |
| | 145 | C$_6$H$_4$CF$_3^-$ |
| SiC | 69 | CF$_3^-$ |
| | 145 | C$_6$H$_4$CF$_3^{-et+}$ |
| | 185 | C—Si—C$_6$H$_4$CF$_3$ |
| | 204 | 185 + 19 (F)$^-$ |
| SiOC | 69 | CF$_3^{-et+}$ |
| | 127 | C$_6$H$_4$CF$_2$H$^-$ |
| | 145 | C$_6$H$_4$CF$_3^-$ |
| | 155 | SiCF$_2$H$^-$ |
| SiO$_2$ | 69 | CF$_3^-$ |
| | 145 | C$_6$H$_4$CF$_3^{-et+}$ |
| | 173 | Si—C$_6$H$_4$CF$_3^+$ |
| | 201 | Si—Si—C$_6$H$_4$CF$_3^+$ |
| | 219 | O—Si—Si—C$_6$H$_4$CF$_3^+$ + 2 |
| | 235 | 219 + 16 (O) |
| | 241 | 235 + 16 (O) |
| | 269 | 241 + 28 (Si) |

In all cases the chemical groups CF$_3$ and C$_6$H$_4$CF$_3$ are observed, which signal modification of the surface.

Example 17

Grafting of Kapton® and PET in the Presence of 4-Nitrobenzene Diazonium in an Alcohol Solution or a Non-Buffered Aqueous Solution Bravo-Diaz et coll. (Costas-Costas, U.; Bravo-Diaz, C.; Gonzalez-Romero, E. *Langmuir* 2004, 20, 1631) have shown that the de-diazotisation reaction (that is the loss of the chemical function diazonium —N≡N$^+$) could be achieved in two different ways: either heterolytically with formation of an aryl cation (Ar$^+$), or homolytically with formation of a radical (Ar$^o$) (Pazo-Llorente, R.; Bravo-Diaz, C.; Gonzalez-Romero, E. *Eur. J. Org. Chem.* 2004, 3221). They showed that ethanolysis is an efficient way of forming an aryl radical through the intermediary of a diazoether (Ar—N═N—OR). Consequently, the homolytic de-diazotisation reaction was carried out in ethanol by activation under ultrasound.

Into a haemolysis tube containing a sample of Kapton® or PET, 213 mg of 4-nitrobenzene diazonium in 6 ml of ethyl alcohol (c=0.1 M) are introduced and placed in an ultrasound vessel for 60 minutes. The sample is then rinsed in distilled water (twice 10 minutes) under ultrasound then dried and again for 10 minutes in acetone under ultrasound. The intensity of the characteristic peaks of the —NO$_2$ chemical group are of the same order of magnitude than when the reaction is carried out in acetonitrile. The characteristic peaks of the graft —C$_6$H$_4$NO$_2$ (NO$_2^+$, C$_6$H$_4$NO$_2^+$ and diminution of the intensity of the peak of the substrate itself) are well identified by Tof-SIMS.

Likewise, Bunnett (Bunnett, J. F.; Yjima, C. *J. Org. Chem.* 1977, 42, 639) showed that it was possible to carry out a de-diazonisation reaction in basic methanol. A sample of Kapton® was placed in a 0.1 M of basic methanol (4% tetramethyl ammonium hydroxide in methanol), which was treated as above. There is no significant difference with grafting carried out in acetonitrile, conversely it seems that the surface of the polymer is modified by basic conditions.

The same reaction was carried out in non-buffered distilled water with the same diazonium concentration: The peaks of the —NO$_2$ chemical group are of the same order of magnitude than when the reaction is carried out in acetonitrile.

Example 18

Grafting of Balloons Used in the Placing of Arterial Stents to Improve Adhesion of the Stent to the Balloon Stents are devices placed inside arteries suffering stenosis. (that is, particularly blocked. Into these devices made of a cylinder of metal trellis is inserted a small balloon (deflated and folded), generally of polyamide, itself fixed to the end of a long catheter. At the time the stent is placed, the cardiologist introduces the stent crimped on the balloon at the end of the catheter. He pushes the device to the position of the stenosis, inflates the balloon, which itself dilates the stent. Once the stent is in place, the balloon is deflated and removed from the artery by the catheter. The stent must be sufficiently attached to the balloon, and therefore the catheter, not to be freed before being put in place and, at the same time, the connection must be sufficiently weak for the balloon to separate from the stent when it is deflated. Adhesion between the balloon and the stent has been improved by treating the surface of the balloon by diazonium salts under ultrasound.

To prevent balloons fixed to the end of the catheter from unfolding, they are kept depressed by aspiration with a syringe fixed to the other end of the catheter. They are then cleaned in ethanol for 10 minutes then dried in the sterilizer at 40° C. for two hours. They are then placed in a solution (H$_2$SO$_4$ 10 mM) of 4-aminobenzoïc acid diazonium salt (0.15 M) under ultrasound in the vessel described above for one hour. They are then rinsed in distilled water (5 minutes) then in acetone (1 minute) under ultrasound and finally dried in a vacuum at 40° C.

The analysis of the grafted balloons is summarised in the Table below.

TABLE 24

Grafting of stents balloon bythe C$_6$H$_4$COOH groups in cm$^{-1}$.

| | $_2$HNC$_6$H$_4$COOH | $^+$$_2$NC$_6$H$_4$COOH | $^-$C$_6$H$_4$COOH | $^-$C$_6$H$_4$COF* |
|---|---|---|---|---|
| COOH | 3400-2200 | 3242 | 3139 | |
| C═O | 1660 | 1719 | | 1843 |
| Aromatic | 841 | 866 | 853 | |
| CH | 769 | 763 | 777 | |
| (outside the plane) | 698 | 702 | 719** 692 | |

*obtained by treating the stent modified by trifluorotriazine (cyanuric fluoride) - below - the position of the C═O band is characteristic of acid fluorides.
**indicates a change of substitution, that is the formation of a polymer layer on the surface.

By ToF-SIMS it is difficult to observe the signature of the C$_6$H$_4$COOH group attached to the balloon surface. The acid function has therefore been transformed into acid fluoride by treatment with 2,4,6-trifluoro 1,3,5-triazine (cyanuric fluoride [675-14-9]). Two balloons are placed in 10 ml of acetonitrile, 200 μl of cyanuric fluoride and 300 μl of pyridine are added; they are left at ambient temperature for 24 hours, rinsed twice in acetone in ultrasound and dried in a vacuum. The IR spectrum shows the characteristic band of acid fluorides (Table 24) and the ToF-SIMS spectrum described in Table 25 indicates both the presence of the C$_6$H$_4$COF grouping and its grafting to the surface of the balloon (m/z=151 and 221). The acid fluorides are highly reactive species, esters or amines can be formed (by reaction with alcohols or amines) to over-functionalise the surface.

TABLE 25

ToF-SIMS spectrum of C$_6$H$_4$COF chemical groups grafted to the surface of balloons.

| m/z | Attribution |
|---|---|
| 19 | F$^-$ |
| 111 | C$_6$H$_4$FO$^-$ |
| 123 | C$_6$H$_4$COF$^+$ |
| 143 | C$_7$H$_5$F$_2$O$^+$ |

Another verification of the grafting of diazonium salts under ultrasound to stents balloon was carried out by grafting C$_6$H$_4$CF$_3$ groups, the signature of which is easy to identify by ToF-SIMS, under the same conditions as above.

TABLE 26

ToF-SIMS spectrum of —C$_6$H$_4$CF$_3$ chemical groups grafted to the surface of balloons.

| m/z | Attribution |
|---|---|
| 19 | F$^-$ |
| 69 | CF$_3^-$ |
| 145 | C$_6$H$_4$CF$_3^-$ |
| 159 | CH$_2$C$_6$H$_4$CF$_3^+$ |
| 160 | NHC$_6$H$_4$CF$_3^-$ |

The tests carried out subsequently on these balloons, the surface of which is modified by —C$_6$H$_4$COOH groups indicate a notable improvement in the adhesion of the balloon to the stent.

Example 19

Grafting of Benzoylphenyl Groups to Polyamide

The grafting of benzoylphenyl groups (—C$_6$H$_4$(C=O) C$_6$H$_5$) is interesting since the carbonyl group under UV radiation leads to a bi-radical apt to react with other molecules and polymers in particular (Adenier, A.; Cabet-Deliry, E.; Lalot, T.; Pinson, J.; Podvorica, F. Chem Mat 2002, 14, 4576). Therefore, under the same conditions as for the CH$_4$ COOH groups, we grafted benzoylphenyl groups starting with 4-aminobenzophenone diazonium salt (C$_6$H$_5$C(=O) C$_6$H$_4$N$_2^+$) onto stents balloon.

On the grafted surface, the C=O band under infrared spectroscopy of the benzophenone (located at 1628 cm$^{-1}$) is too close to that of polyamide (1636 cm$^{-1}$) to be distinguished; conversely vibrations of the aromatic cycle (1586 cm$^{-1}$) and the vibrations outside the plane of the C—H aromatics (703 cm$^{-1}$) are observed. The ToF-SIMS spectrum of the balloon surface confirms grafting.

TABLE 27

ToF-SIMS spectrum of benzoylphenyl groups grafted onto polyamide.

| m/z | Attribution |
| --- | --- |
| 77 | C$_6$H$_5^+$ |
| 105 | C$_6$H$_5$C=O$^+$ |
| 119 | CH$_3$C$_6$H$_4$C=O$^+$ |
| 133 | CH$_3$CH$_2$C$_6$H$_4$C=O$^+$ |

Example 20

Grafting in an Aqueous Acid Solution of Kapton® in the Presence of 4-Nitrobenzene Diazonium. Use of PCT Systems Ultrasound Vessels The equipment used is a Megasonics PCT system using 3 generators coupled to a circular plane transducer of ~350 mm in diameter. A water-circulation system enables the renewal of a liquid layer at the surface of the transducer, injected by a central nozzle. The following parameters were used for the sound level:
1) Excitation method
  a. Conventional "Megasonic" generator (collimated monofrequency)
  b. "Liquid Plasma™" (multi-frequency with multidirectional propagation of the energy transmitted)
2) Power: low, medium, high (<10 W/cm$^2$)
3) Treatment time: 10 min
4) The presence of a ceramic ring on the transducer, which increases the volume of the liquid water on the surface of the transducer itself. This should increase the transmission of sonic energy onto the walls of the beaker (see below)

The samples were treated in pairs (SiO$_2$+Kapton®) in a quartz beaker placed on the transducer. 150 ml of 0.2 M aqueous sulphuric acid solution containing the 4-nitrobenzene diazonium (0.15 M) were used and renewed for each sample pair. After rinsing, the samples were analysed by IR and ToF-SIMS. The spectra clearly show the presence of the chemical function —NO$_2$ (in infrared at 1363 and 1502 cm$^{-1}$ for the anti-symmetrical and symmetrical vibrations of —NO$_2$ and m/z=46 in ToF-SIMS corresponding to the NO$_2^-$ fragment). These qualitative spectra do not allow major differences to be observed according to the method of producing the ultrasound or the power of the machine.

CONCLUSION

It has been shown that it is possible to functionalise the surface of polymers and dielectrics by reaction with aryl groups deriving from diazonium salt. The results above show that it is possible to graft a variety of substituted phenyl groupings: (—C$_6$H$_4$NO$_2$, —C$_6$H$_4$Br, —C$_6$H$_4$COOH, —C$_6$H$_4$CF$_3$, anthraquinone). The reality of this grafting has been proven by IR, ToF-SIMS and angle of contact.

The reduction of diazonium in homogenous solution leads to aryl radicals, which graft themselves to the surface and their presence on the surfaces studied is observed.

Reduction by NaI The presence of Br on the surfaces studied is observed in all cases. That iodine fixes itself to the surfaces studied can also be seen.

Reduction by ferrocenemethanol It has been possible to graft bromophenyl groupings, both onto polymers and inorganic dielectrics. Bromine on the surface is also seen in all the cases studied. Carboxyphenyl groups, which make the surface hydrophilic, have also been grafted.

Reduction by hypophosphorous acid. This reactive agent operating in aqueous solution and at a more accessible cost than ferrocenemethanol enabled iodine, bromine and trifluorophenyl groups to be grafted both onto organic polymers and inorganic dielectrics.

Photochemistry of charge transfer complexes It has been possible to carry out grafting either by using 1,4-dimethoxybenzene as the electron donor in the excited state, or by using the electron-rich polymers themselves such as PET, PEEK or ABS. Thus it has been possible to graft bromo- or trifluoro or carboxyphenyl groups. The reaction is possible either in an organic solvent or an aqueous solution. The reaction times are short, which increases the practical interest of this reaction.

Use of ultrasound. It has been shown that the reaction allows grafting of the nitro, bromo, carboxylic, anthraquinone and trifluoromethyl groups. The samples grafted include both organic polymers and inorganic dielectrics. The reaction can be carried out either in an aprotic solvent such as acetonitrile or in water. Grafting reaches its maximum after approximately 20 minutes of irradiation.

The invention claimed is:
1. A method of modifying a surface of an insulating material, semiconductor material, binary compound, ternary compound or a composite thereof, the surface being modified by grafting aromatic groups onto said surface, said aromatic groups optionally substituted by functional groups, the aromatic groups being grafted to the surface by a covalent bond, the graft resisting washing by ultrasound,
said method comprising:
placing said surface in contact with a diazonium salt, said diazonium salt carrying said aromatic group, at a concentration greater than 0.05 M; and
reducing said diazonium salt by,
(i) utilizing a reducer,
(ii) photochemically irradiating a charge transfer complex formed from said diazonium salt, or
(iii) treating said diazonium salt by ultrasound, to achieve grafting of said aromatic groups onto said surface,
the surface being placed in the presence of the reduced diazonium salt for a time period of less than 60 minutes.

2. The method according to claim 1, wherein the diazonium salt corresponds to the formula $ArN_2^+X$, where Ar is an aromatic group and X is an anion selected from the group consisting of: halogens, sulphates, phosphates, perchlorates, tetrafluoroborates, carboxylates and hexafluorophosphates.

3. The method according to claim 1, wherein the diazonium salt is:
a diazoresin,
or a diazonium salt selected from the group consisting of:

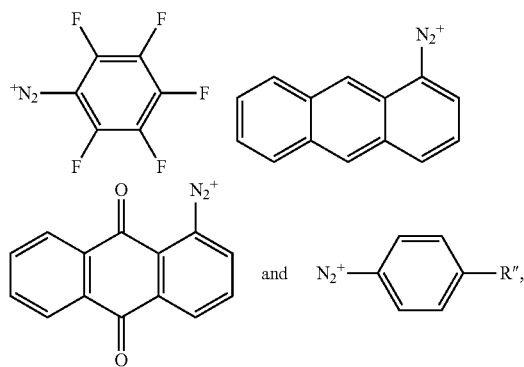

of:
R" being selected from the following groups: —$CH_3$, n-$C_4H_9$, n-$C_{12}H_{25}$, —$OC_{12}H_{25}$, —$OC_{16}H_{33}$, Cl, —Br, —I, —$CH_2Br$, —$CH(CH_3)Br$, —$CH_2$—O—C(=O) $CH(CH_3)$ Br, —$CH_2$—O—C(=O)C$(CH_3)_2$Br, —OH, —$CH_2OH$, —SH, —$CH_2CH_2SH$, —CHO, —$COCH_3$, COOH, 3,4-$(COOH)_2$, 3-COOH-4-$NO_2$, 3,4-(C(=O) F$)_2$, —$CH_2COOH$, —$CH_2CH_2COOH$, —$COOC_2H_5$, —NHC(=O)Ot-Bu, —NHC(=O)$CH_3$, —NHC(=O) $CF_3$, $CH_2CH_2NH_3+$, —CN, 3,4-$(CN)_2$, 3-$NO_2$, 4-$NO_2$, pyrrolyl, o-hydroxybenzoic, 2-(2-thiophen-3-yl-acetyl)-aminoethyl, 4-benzoylbenzene, 4-(2,5-dioxo-2,5-dihydro-pyrrol-1-yl), 3-isonitrile, 3-dioxo-1H-isochromene-5-diazonium-3H-benzo[de]chromene-5-diazonium, 3-(2,5-dioxo-2,5-dihydro-pyrrol-1-yl) and 4-[1-(2,2,6,6-tetramethyl-piperidine-1-yloxy)]-ethyl.

4. The method according to claim 1, wherein the diazonium salt is reduced by utilizing a reducer.

5. The method according to claim 4, wherein the reducer is selected from the group consisting of: a reducer having oxidation potentials close to 0 V/SCE or negative, hypophosphorous acid, halide salts, sodium iodide, ferrocene and its derivatives, ferrocene-methanol, carboxylic ferrocene acid, ascorbic acid, dimethylaminoborane, sodium borohydride, viologene salts, methyl-viologene, benzoviologene, phenolates, and bisphenolates.

6. The method according to claim 4, wherein the surface is placed in contact with the diazonium salt and the reducer, said reducer being present in a stoichiometric quantity or greater, relative to said diazonium salt.

7. The method according to claim 1, wherein the diazonium salt is reduced by photochemically irradiating a charge transfer complex formed from the diazonium salt.

8. The method according to claim 7, further comprising:
forming a charge transfer complex by reacting diazonium salt and an electron-donor aromatic compound,
irradiating said charge transfer complex to reduce the diazonium salt, and
forming aryl radicals which bond to the surface.

9. The method according to claim 8, further comprising:
placing the surface in contact with the diazonium salt and an electron-donor aromatic compound, to obtain a charge transfer complex,
photochemically irradiating said charge transfer complex, to reduce the diazonium salt, and
forming aryl radicals which bond to the surface.

10. The method according to claim 1, wherein the diazonium salt is reduced by treating the diazonium salt by ultrasound.

11. The method according to claim 10, further comprising placing the surface in contact with the diazonium salt and treating with ultrasound.

12. The method according to claim 1, wherein the diazonium salt carrying the aromatic group is at a concentration of approximately 0.5 M to approximately 4 M.

13. The method according to claim 1, wherein the surface is placed in the presence of the reduced diazonium salt for a time period of 1 to 60 minutes.

14. The method according to claim 1, wherein the surface is placed in the presence of the reduced diazonium salt for a time period of 1 to 10 minutes.

* * * * *